US012796240B2

(12) United States Patent
Won et al.

(10) Patent No.: US 12,796,240 B2
(45) Date of Patent: Nov. 10, 2026

(54) DISPLAY APPARATUS

(71) Applicant: SAMSUNG DISPLAY CO., LTD., Yongin-si (KR)

(72) Inventors: Byeonghee Won, Yongin-si (KR); Youngseok Seo, Yongin-si (KR); Inseon Yoon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 838 days.

(21) Appl. No.: 17/874,703

(22) Filed: Jul. 27, 2022

(65) Prior Publication Data

US 2023/0037433 A1 Feb. 9, 2023

(30) Foreign Application Priority Data

Aug. 6, 2021 (KR) ........................ 10-2021-0104196

(51) Int. Cl.

*H01L 27/32* (2006.01)
*H10K 59/124* (2023.01)
*H10K 77/10* (2023.01)
*H10K 59/122* (2023.01)
*H10K 102/00* (2023.01)

(52) U.S. Cl.

CPC ......... *H10K 59/124* (2023.02); *H10K 77/111* (2023.02); *H10K 59/122* (2023.02); *H10K 2102/311* (2023.02)

(58) Field of Classification Search

CPC .. H10K 59/122; H10K 59/124; H10K 77/111; H10K 2102/311

USPC ........................................................ 257/232

See application file for complete search history.

(56) References Cited

U.S. PATENT DOCUMENTS

| | | | | |
|---|---|---|---|---|
| 10,121,844 | B2 | 11/2018 | Park et al. | |
| 10,255,855 | B2 | 4/2019 | Park et al. | |
| 10,777,631 | B2 | 9/2020 | Cho et al. | |
| 10,964,769 | B2 | 3/2021 | Park et al. | |
| 11,114,631 | B2 | 9/2021 | Guo et al. | |
| 2015/0173186 | A1* | 6/2015 | Na | H05K 1/0283 29/850 |
| 2017/0062528 | A1 | 3/2017 | Aoyama et al. | |
| 2017/0062534 | A1* | 3/2017 | Jiang | H10K 50/844 |
| 2020/0245501 | A1* | 7/2020 | Wu | F28F 3/02 |
| 2020/0328269 | A1 | 10/2020 | Shin et al. | |
| 2020/0344899 | A1 | 10/2020 | Myung et al. | |

(Continued)

FOREIGN PATENT DOCUMENTS

| | | | |
|---|---|---|---|
| CN | 108550587 | A | 9/2018 |
| CN | 109791747 | A | 5/2019 |

(Continued)

*Primary Examiner* — Dzung Tran

(74) *Attorney, Agent, or Firm* — CANTOR COLBURN LLP

(57) ABSTRACT

A display apparatus includes a first base layer including a first pixel area and a second pixel area spaced apart from each other, and a connection area connecting the first pixel area to the second pixel area, the first base layer including a first surface and a second surface opposite to each other, a first pixel disposed in the first pixel area, and a second pixel disposed in the second pixel area. The first pixel and the second pixel are arranged on the first surface of the first base layer, and the first base layer includes a plurality of first protrusions arranged on the second surface of the connection area.

15 Claims, 19 Drawing Sheets

(56) References Cited

U.S. PATENT DOCUMENTS

| | | | | |
|---|---|---|---|---|
| 2020/0381640 | A1* | 12/2020 | Joo | B32B 7/022 |
| 2021/0005700 | A1 | 1/2021 | Park et al. | |
| 2021/0091317 | A1* | 3/2021 | Zhu | G06F 1/1652 |
| 2021/0097902 | A1* | 4/2021 | Hong | H10K 50/844 |
| 2021/0234129 | A1* | 7/2021 | Zhang | H10K 77/00 |
| 2021/0335951 | A1 | 10/2021 | Wang et al. | |
| 2021/0354435 | A1* | 11/2021 | Xu | H10D 86/411 |

FOREIGN PATENT DOCUMENTS

| | | | |
|---|---|---|---|
| CN | 110235240 | A | 9/2019 |
| CN | 111564478 | A | 8/2020 |
| KR | 1020170049787 | A | 5/2017 |
| KR | 1020170110209 | A | 10/2017 |
| KR | 1020190062666 | A | 6/2019 |
| KR | 1020190081281 | A | 7/2019 |
| KR | 1020190107238 | A | 9/2019 |
| KR | 1020200052167 | A | 5/2020 |
| KR | 1020200070336 | A | 6/2020 |
| KR | 1020200119452 | A | 10/2020 |
| KR | 1020210005452 | A | 1/2021 |

* cited by examiner

DISPLAY APPARATUS

This application claims priority to Korean Patent Application No. 10-2021-0104196, filed on Aug. 6, 2021, and all the benefits accruing therefrom under 35 U.S.C. § 119, the content of which in its entirety is herein incorporated by reference.

BACKGROUND

1. Field

Embodiments relate to a display apparatus.

2. Description of the Related Art

Mobile electronic devices are being widely used. Recently, tablet personal computers ("PCs"), in addition to small-sized electronic devices such as mobile phones, are being widely used as the mobile electronic devices.

In order to support various functions, for example, to provide a user with visual information such as images or videos, the mobile electronic devices include a display. Recently, as components for driving such displays are becoming miniaturized, a proportion of occupancy of the displays in electronic devices is gradually increasing.

Flexible display apparatuses capable of being bent, folded, or rolled are being recently researched and developed. Further, research and development of a stretchable display apparatus capable of being changed into various shapes is being actively conducted.

SUMMARY

Embodiments include a display apparatus having increased flexibility.

Additional features will be set forth in portion in the description which follows and, in part, will be apparent from the description, or may be learned by practice of the presented embodiments.

According to an embodiment of the invention, a display apparatus includes a first base layer including a first pixel area and a second pixel area spaced apart from each other, and a connection area connecting the first pixel area to the second pixel area, the first base layer including a first surface and a second surface opposite to each other, a first pixel disposed in the first pixel area, and a second pixel disposed in the second pixel area. The first pixel and the second pixel are arranged on the first surface of the first base layer, and the first base layer includes a plurality of first protrusions arranged on the second surface of the connection area.

In an embodiment, the plurality of first protrusions may be arranged on opposite ends of the connection area.

In an embodiment, the plurality of first protrusions may extend in a width direction of the connection area.

In an embodiment, the display apparatus may further include a second base layer disposed on the second surface of the first base layer, and a barrier layer between the first base layer and the second base layer. The second base layer may not overlap the plurality of first protrusions in a thickness direction of the second base layer, and the barrier layer may cover the plurality of first protrusions.

In an embodiment, a thickness of the second base layer may be substantially equal to a length of each of the plurality of first protrusions in the thickness direction of the second base layer.

In an embodiment, the first base layer may further include a plurality of second protrusions arranged on the second surface of each of the first pixel area and the second pixel area.

In an embodiment, the connection area may include a center area, a first edge area between the center area and the first pixel area, and a second edge area between the center area and the second pixel area, and the plurality of first protrusions may be arranged in the center area, the first edge area, and the second edge area.

In an embodiment, the first base layer may further include a plurality of second protrusions arranged on the second surface of the connection area, the connection area may further include a first area between the center area and the first edge area, and a second area between the center area and the second edge area, the plurality of second protrusions may be arranged in the first area and the second area, and a first distance between adjacent first protrusions from among the plurality of first protrusions may be different from a second distance between adjacent second protrusions among the plurality of second protrusions.

In an embodiment, the first distance may be greater than the second distance.

In an embodiment, the display apparatus may further include an insulating layer disposed on the first surface of the first base layer and in which a plurality of first grooves is defined in the connection area.

In an embodiment, the connection area may include a center area, a first edge area between the center area and the first pixel area, and a second edge area between the center area and the second pixel area, and the plurality of first grooves may be arranged in at least one of the center area, the first edge area, and the second edge area.

In an embodiment, a plurality of second grooves may be defined in the insulating layer in the connection area, the connection area may further include a first area between the center area and the first edge area, and a second area between the center area and the second edge area, the plurality of first grooves may be arranged in the center area, the first edge area, and the second edge area, the plurality of second grooves may be arranged in the first area and the second area, and a first width of each of the plurality of first grooves may be different from a second width of each of the plurality of second grooves.

In an embodiment, the first width may be greater than the second width.

In an embodiment, each of the first pixel and the second pixel may include a pixel circuit, and a display element disposed on the pixel circuit and connected to the pixel circuit, and the insulating layer may be between the plurality of pixel circuits and the plurality of display elements.

In an embodiment, each of the first pixel and the second pixel may include a pixel circuit, and a display element including a pixel electrode disposed on the pixel circuit and connected to the pixel circuit, and the insulating layer may include a planarization layer between the pixel circuits of the first and second pixels and the display elements of the first and second pixels, and a pixel defining layer disposed on the planarization layer and exposing at least a portion of each of the pixel electrodes of the first pixel and the second pixel.

In an embodiment, the planarization layer may include a third surface facing the first surface of the first base layer, and a fourth surface opposite to the third surface, the pixel defining layer may include a plurality of first insulating patterns exposing at least a portion of each of the plurality of pixel electrodes, and a plurality of second insulating patterns arranged in the connection area, and the plurality of first grooves may be defined by a portion of the fourth surface of the planarization layer, the plurality of first insulating patterns, and the plurality of second insulating patterns.

According to an embodiment of the invention, a display apparatus includes a base layer including a first pixel area and a second pixel area spaced apart from each other, and a connection area connecting the first pixel area to the second pixel area, a first pixel disposed in the first pixel area and including a pixel circuit and a pixel electrode connected to the pixel circuit, a second pixel disposed in the second pixel area and including a pixel circuit and a pixel electrode connected to the pixel circuit, a first insulating layer between the pixel circuits of the first and second pixels and the pixel electrodes of the first and second pixels, a first insulating pattern disposed on the first insulating layer and disposed in the connection area, and a second insulating pattern disposed on the first insulating pattern.

In an embodiment, the display apparatus may further include a second insulating layer disposed on the first insulating layer and including a plurality of third insulating patterns exposing at least a portion of each of the plurality of pixel electrodes and the first insulating pattern.

In an embodiment, the first insulating pattern and the second insulating pattern may be unitary with each other.

In an embodiment, the display apparatus may further include a light-shielding layer disposed on the second insulating pattern.

In an embodiment, the display apparatus may further include a first color filter layer disposed on the light shielding layer, a second color filter layer disposed on the first color filter layer, and a third color filter layer disposed on the second color filter layer.

In an embodiment, a plurality of grooves may be defined in the first insulating layer in the connection area.

In an embodiment, the plurality of grooves and the first insulating pattern and the second insulating pattern may not overlap each other.

In an embodiment, the connection area may include a center area, a first edge area between the center area and the first pixel area, a second edge area between the center area and the second pixel area, a first area between the center area and the first edge area, and a second area between the center area and the second edge area, the plurality of grooves may be arranged in at least one of the center area, the first edge area, and the second edge area, and the first insulating pattern and the second insulating pattern may be arranged in at least one of the first area and the second area.

In an embodiment, the base layer may include a first surface and a second surface opposite to each other, the first pixel and the second pixel may be arranged on the first surface of the base layer, and the base layer may include a plurality of first protrusions arranged on the second surface of the connection area.

In an embodiment, the plurality of first protrusions may extend in the width direction of the connection area.

In an embodiment, the base layer may further include a plurality of second protrusions arranged on the second surface of each of the first pixel area and the second pixel area.

In an embodiment, the connection area may include a center area, a first edge area between the center area and the first pixel area, and a second edge area between the center area and the second pixel area, and the plurality of first protrusions may be arranged in at least one of the center area, the first edge area, and the second edge area.

In an embodiment, the base layer may further include a plurality of second protrusions arranged on the second surface of the connection area, the connection area may further include a first area between the center area and the first edge area, and a second area between the center area and the second edge area, the plurality of first protrusions may be arranged in the center area, the first edge area, and the second edge area, the plurality of second protrusions are arranged in the first area and the second area, and a first distance between adjacent first protrusions from among the plurality of first protrusions may be different from a second distance between adjacent second protrusions among the plurality of second protrusions.

In an embodiment, the first distance may be greater than the second distance.

These and/or other features will become apparent and more readily appreciated from the following description of the embodiments, the claims, and the accompanying drawings.

These embodiments may be implemented by a system, a method, a computer program, or a combination thereof.

BRIEF DESCRIPTION OF THE DRAWINGS

The above and other embodiments, features, and advantages of the invention will be more apparent from the following description taken in conjunction with the accompanying drawings, in which.

DETAILED DESCRIPTION

Figure 1:
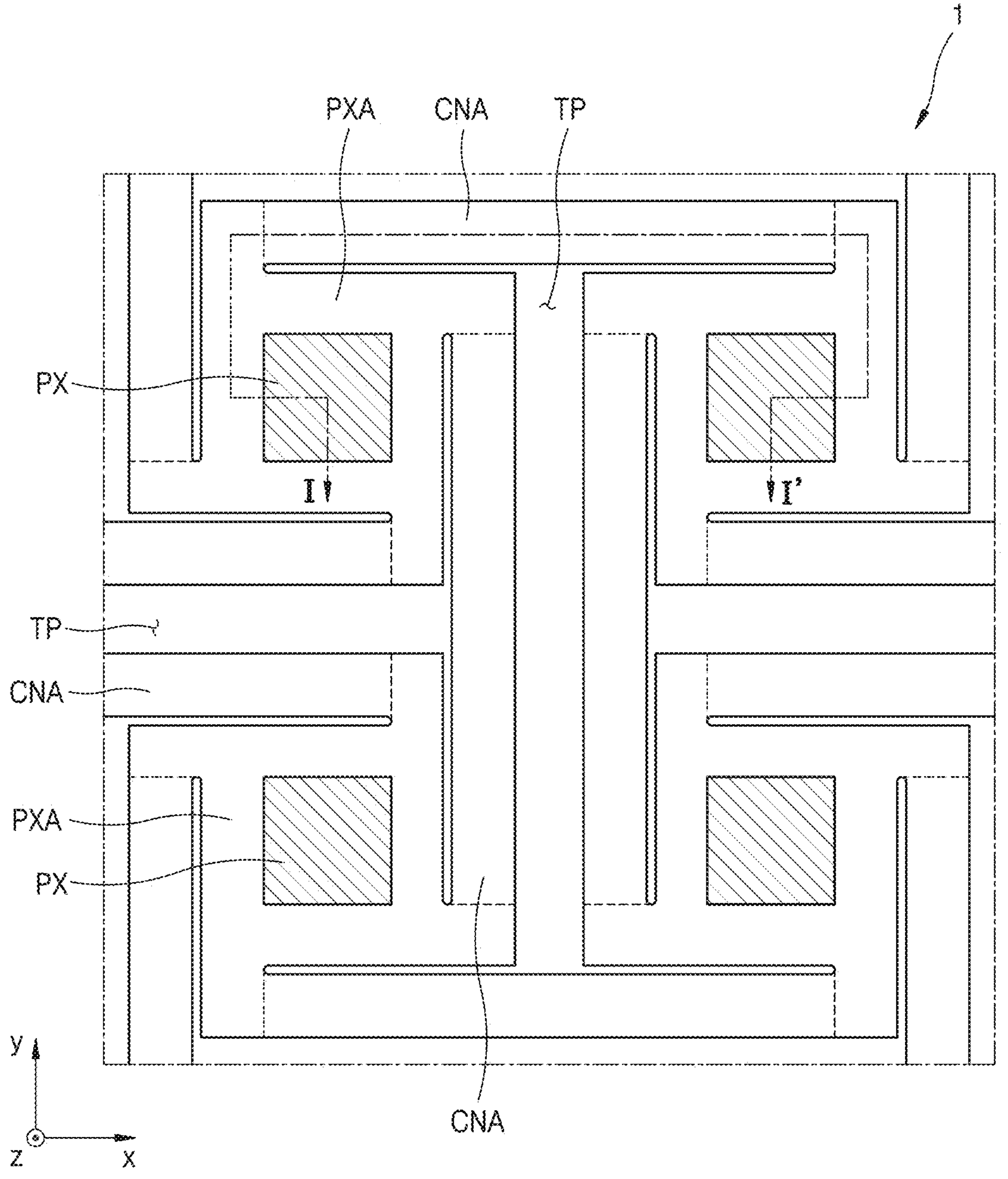
FIG. 1 is a schematic magnified plan view of an embodiment of a portion of a display apparatus.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. Hereinafter, effects and features of the invention and a method for accomplishing them will be described more fully with reference to the accompanying drawings, in which embodiments of the invention are shown. The invention may, however, be embodied in many different forms and should not be construed as limited to the embodiments set forth herein.

Embodiments of the invention will be described below in more detail with reference to the accompanying drawings. Those components that are the same as or are in correspondence with each other are rendered the same reference numeral regardless of the figure number, and redundant explanations are omitted.

It will be understood that although the terms "first," "second," etc. may be used herein to describe various components, these components should not be limited by these terms. These terms are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "disposed on" another layer, region, or component, it can be directly or indirectly "disposed on" the other layer, region, or component. That is, for example, intervening layers, regions, or components may be present.

Sizes of elements in the drawings may be exaggerated for convenience of explanation. For example, since sizes and thicknesses of components in the drawings are arbitrarily illustrated for convenience of explanation, the invention is not limited thereto.

When a certain embodiment may be implemented differently, a specific process order may be performed differently from the described order. For example, two consecutively described processes may be performed substantially at the same time or performed in an order opposite to the described order.

In the specification, "A and/or B" represents A or B, or A and B. The expression "at least one of A and B" indicates only A, only B, both A and B, or variations thereof.

It will also be understood that when a layer, region, or component is referred to as being "connected" or "coupled" to another layer, region, or component, it can be directly "connected" or "coupled" to the other layer, region, or/and component or intervening layers, regions, or components may be present. For example, when a layer, region, or component is referred to as being "electrically connected" or "electrically coupled" to another layer, region, or component, it can be directly "electrically connected" or "coupled" to the other layer, region, and/or component or intervening layers, regions, or components may be present.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

FIG. 1 is a schematic magnified plan view of an embodiment of a portion of a display apparatus.

Referring to FIG. 1, the display apparatus 1 may include a pixel area PXA, a connection area CNA, a penetrating area TP, and a pixel PX.

The pixel area PXA may be provided in plural, and a plurality of pixel areas PXA may be spaced apart from one another. Two adjacent pixel areas PXA may be symmetric to each other. In an embodiment, in FIG. 1, two pixel areas PXA that are laterally adjacent to each other may be symmetric to each other about an axis of symmetry that is located between the two pixel areas PXA and is parallel to a first direction (e.g., a ±y direction), for example. Likewise, in FIG. 1, two pixel areas PXA that are vertically adjacent to each other may be symmetric to each other about an axis of symmetry that is located between the two pixel areas PXA and is parallel to a second direction (e.g., a ±x direction).

FIG. 1 illustrates that two adjacent pixel areas PXA are symmetric to each other. However, in another embodiment, two adjacent pixel areas PXA may be arranged to have the same shape.

In FIG. 1, the pixel area PXA has an approximately quadrangular (e.g., rectangular) planar shape. However, in another embodiment, the planar shape of the pixel area PXA may be any of various shapes such as polygons (such as, a triangle, an octagon, and a hexagon), a circle, an oval, and a closed loop shape.

The connection area CNA may extend to adjacent pixel areas PXA from among the plurality of pixel areas PXA to each other. The connection area CNA may connect adjacent pixel areas PXA from among the plurality of pixel areas PXA to each other. The connection area CNA may be unitary with the pixel area PXA, and may extend from one pixel area PXA to another pixel area PXA. In an embodiment, as shown in FIG. 1, the connection area CNA may extend in the first direction (e.g., the ±y direction) or the second direction (e.g., the ±x direction), for example.

The penetrating area TP may be surrounded by the pixel area PXA and the connection area CNA. The penetrating area TP may be defined as a closed curve including an edge of the pixel area PXA and an edge of the connection area CNA.

The penetrating area TP may correspond to at least a portion of the display apparatus 1 that is penetrated, or a portion of the display apparatus 1 that is recessed. The penetrating area TP may reduce the weight of the display apparatus 1 and improve the flexibility of the display apparatus 1. When an external force (such as, a bending force, a curving force, a pulling force, or a pushing force) is applied to the display apparatus 1, the shape of the penetrating area TP may be changed, thereby easily reducing occurrence of stress during deformation of the display apparatus 1. Due to the penetrating area TP, abnormal deformation of the display apparatus 1 may be prevented, and durability thereof may be improved.

The pixel PX may display an image. The pixel PX may be a minimum unit that displays an image, and may include at least one pixel circuit and at least one display element. The pixel PX may be provided in plural, and a plurality of pixels PX may be disposed on the plurality of pixel areas PXA, respectively.

The display element may be an organic light-emitting diode ("OLED") including an organic emission layer. In an alternative embodiment, the display element may be a light-emitting diode ("LED"). The size of the LED may be microscale or nanoscale. In an embodiment, the LED may be a micro-LED or a nanorod LED, for example. In an alternative embodiment, the display element may be a quantum dot LED including a quantum dot emission layer. In an alternative embodiment, the display element may be an inorganic LED including an inorganic semiconductor.

An embodiment of the pixel PX shown in FIG. 1 will now be described with reference to FIG. 2 by focusing on a case where the display element is an OLED.

Figure 2:
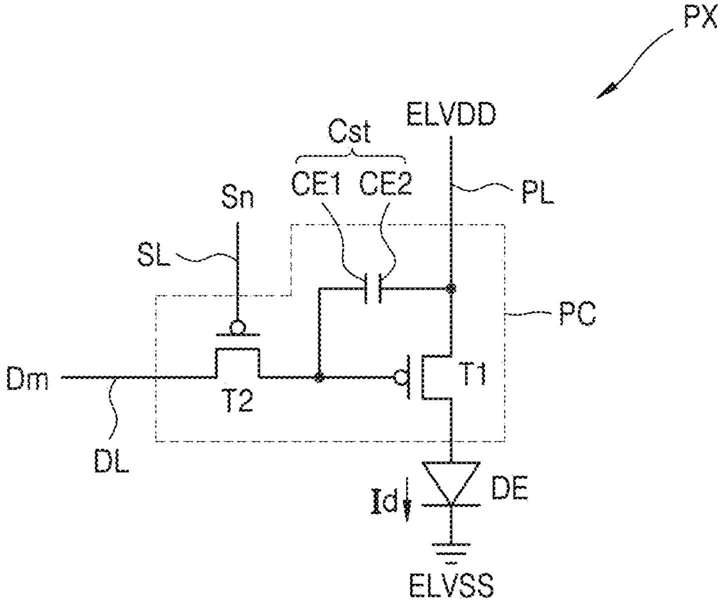
FIG. 2 is a schematic equivalent circuit diagram of a pixel.

FIG. 2 is a schematic equivalent circuit diagram of an embodiment of a pixel.

Referring to FIG. 2, each pixel PX may include a pixel circuit PC connected to a scan line SL and a data line DL, and a display element DE connected to the pixel circuit PC. A cathode of the display element DE may be a common electrode to which a second driving voltage ELVSS is applied.

In FIG. 2, the pixel PX includes one pixel circuit PC and one display element DE. However, the pixel PX may include at least one pixel circuit PC and at least one display element DE. In an embodiment, the pixel PX may include three pixel circuits PC and three display elements DE, or may include four pixel circuits PC and four display elements DE, for example. Other various modifications may be made thereto.

The pixel circuit PC may include a first transistor T1, a second transistor T2, and a storage capacitor Cst.

The first transistor T1 may be a driving transistor in which the magnitude of a drain current is determined according to a gate-source voltage, and the second transistor T2 may be a switching transistor that is turned on/off according to a gate-source voltage, substantially, a gate voltage. The first transistor T1 and the second transistor T2 may be implemented using thin-film transistors.

Hereinafter, the first transistor T1 may be also referred to as a driving transistor, and the second transistor T2 may be also referred to as a scan transistor.

A storage capacitor Cst is connected between the power line PL and a gate of the driving transistor T1. The storage capacitor Cst may include a second electrode CE2 connected to the power line PL, and a first electrode CE1 connected to the gate of the driving transistor T1. The storage capacitor Cst may store a voltage corresponding to a difference between a voltage received from the scan transistor T2 and the first driving voltage ELVDD supplied to the power line PL.

The driving transistor T1 may control the magnitude of a current Id flowing from the power line PL to the display element DE according to the gate-source voltage. The display element DE may emit light having a predetermined brightness by the driving current Id. The driving transistor T1 may include a gate connected to the first electrode CE1 of the storage capacitor Cst, a source connected to the power line PL, and a drain connected to the display element DE.

The scan transistor T2 may transmit the data voltage Dm to the gate of the driving transistor T1 in response to a scan signal Sn. The scan transistor T2 may include a gate connected to the scan line SL, a source connected to the data line DL, and a drain connected to the gate of the driving transistor T1.

Although a case where the pixel circuit PC includes two transistors and one storage capacitor is illustrated in FIG. 2, the invention is not limited thereto. In an embodiment, the pixel circuit PC may include three or more transistors and/or two or more storage capacitors, for example. In an embodiment, the pixel circuit PC may include seven transistors and one storage capacitor.

Figure 3A:
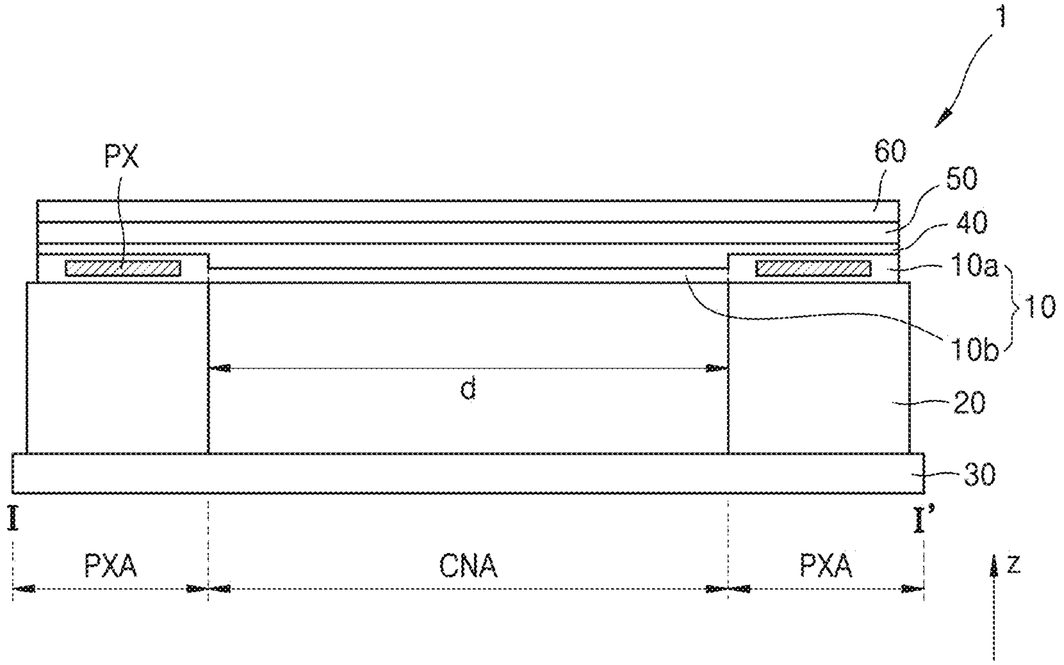
FIG. 3A is a cross-sectional view of an embodiment of the display apparatus of FIG. 1 taken along line I-I'.
Figure 3B:
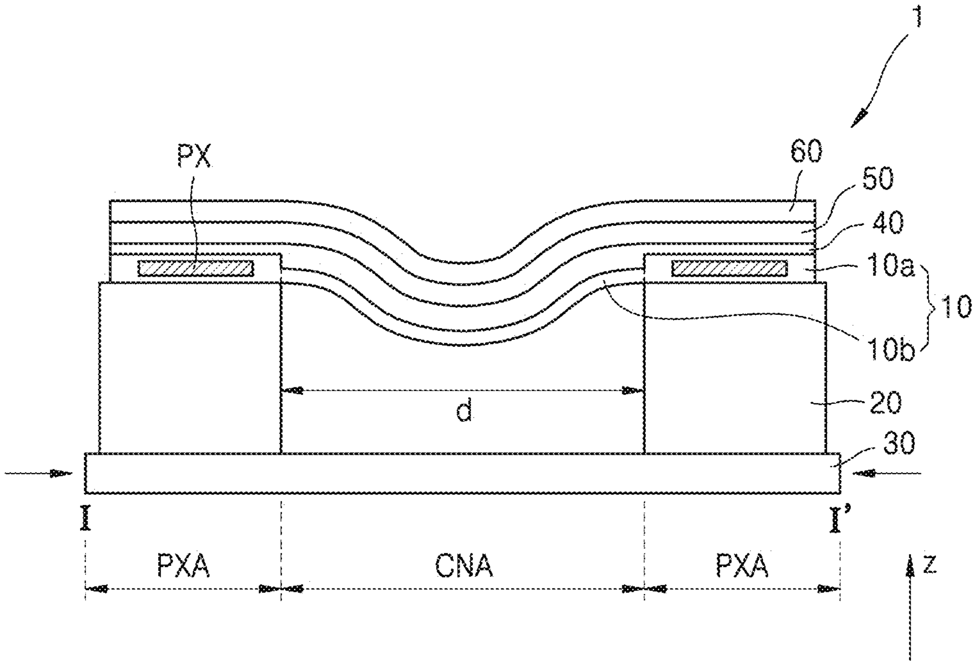
FIG. 3B is a cross-sectional view of an embodiment of the display apparatus of FIG. 1 taken along line I-I'.
Figure 4:
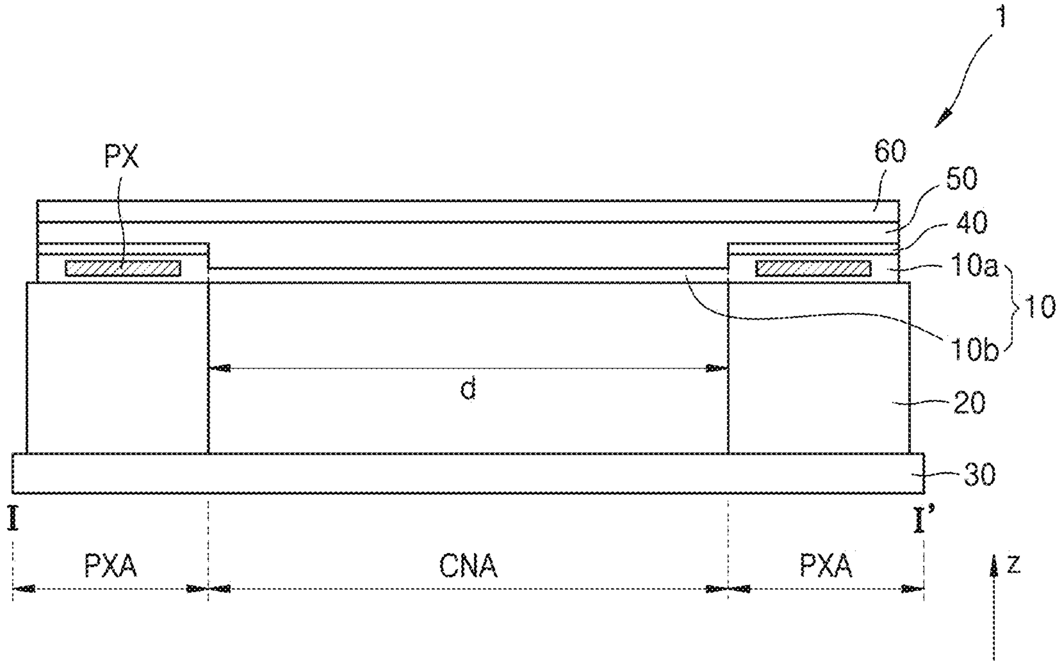
FIG. 4 is a cross-sectional view of an embodiment of the display apparatus of FIG. 1 taken along line I-I'.

FIGS. 3A, 3B, and 4 are cross-sectional views of the display apparatus of FIG. 1 taken along line I-I'. In detail, FIG. 3A illustrates the display apparatus 1 before an external force is applied thereto, and FIG. 3B illustrates the display apparatus 1 after an external force is applied thereto. FIG. 4 is a modification of FIG. 3A, and is thus different therefrom in the structure of an encapsulation layer 40. FIG. 3A will now be focused on and described, and differences between FIGS. 3A and 4 will be mainly described.

Referring to FIGS. 3A and 3B, a display apparatus 1 may include a display panel 10, a pillar layer 20, a flexible substrate 30, the encapsulation layer 40, an optical functional layer 50, and a cover window 60.

The display panel 10 may include a pixel portion *10a* disposed in the pixel area PXA, and a connection portion *10b* disposed in the connection area CNA. The pixel portion *10a* may include a pixel PX. The pixel portion *10a* may be a portion that displays an image through the pixel PX. The connection portion *10b* may extend to adjacent pixel portions *10a* to each other. The connection portion *10b* may connect adjacent pixel portions *10a* to each other. The pixel portion *10a* and the connection portion *10b* may be unitary with each other.

Figure 6:
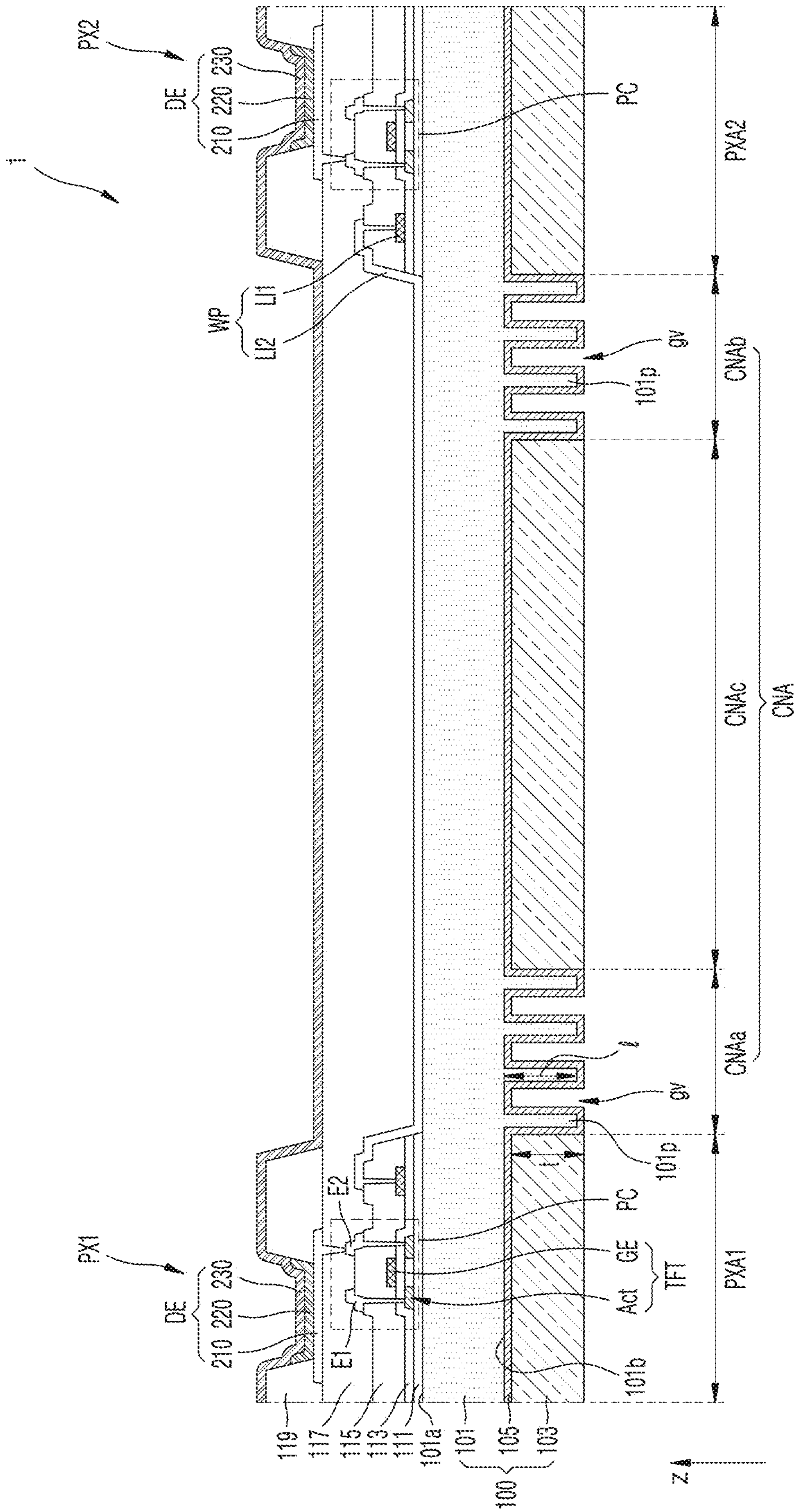
FIG. 6 is a schematic cross-sectional view of a display apparatus.

As shown in FIG. 6, which will be described later, the display panel 10 may include insulating layers. Because some insulating layers may be omitted from the connection portion *10b*, a thickness of the connection portion *10b* may be less than that of the pixel portion *10a*.

Referring back to FIG. 3A, the pillar layer 20 may be disposed under the display panel 10. The pillar layer 20 may support the display panel 10. Even when an external force is applied to the display apparatus 1, the shape of the pillar layer 20 may not change.

In an embodiment, the pillar layer 20 may be disposed under the pixel portion 10$a$ of the display panel 10. In other words, the pillar layer 20 may overlap the pixel portion 10$a$ and may not overlap the connection portion 10$b$. In other words, the pillar layer 20 may be disposed in the pixel area PXA. Because a plurality of pillar layers 20 may be arranged under a plurality of pixel portions 10$a$ spaced apart from one another, respectively, the plurality of pillar layers 20 may be spaced apart from one another.

The flexible substrate 30 may be disposed under the pillar layer 20. The flexible substrate 30 may be disposed in the pixel area PXA and the connection area CNA. The flexible substrate 30 may include a flexible material. The flexible substrate 30 may have higher flexibility than the pillar layer 20.

The encapsulation layer 40 may be disposed on the display panel 10. The encapsulation layer 40 may cover the pixel PX. In some embodiments, the encapsulation layer 40 may include at least one inorganic encapsulation layer. The first inorganic encapsulation layer may include at least one inorganic insulating material such as a silicon oxide ($SiO_x$), a silicon nitride ($SiN_x$), a silicon oxynitride ($SiO_xN_y$), an aluminum oxide ($Al_2O_3$), a titanium oxide ($TiO_2$), a tantalum oxide ($Ta_2O_5$), a hafnium oxide ($HfO_2$), or a zinc oxide ($ZnO_x$), and may be formed or provided by chemical vapor deposition ("CVD"). In a zinc oxide ($ZnO_x$), x may be a real number between 1 and 2. In an embodiment, x may be 1 or 2. In other words, a zinc oxide ($ZnO_x$) may be a zinc oxide (ZnO) and/or a zinc peroxide ($ZnO_2$), for example.

In an embodiment, the encapsulation layer 40 may further include at least one organic encapsulation layer. In an embodiment, the encapsulation layer 40 may include a first inorganic encapsulation layer, an organic encapsulation layer on the first inorganic encapsulation layer, and a second inorganic encapsulation layer on the organic encapsulation layer, for example. The organic encapsulation layer may include a polymer-based material. Examples of the polymer-based material may include an acrylic resin, an epoxy-based resin, polyimide, and polyethylene.

In an embodiment, as shown in FIG. 3A, the encapsulation layer 40 may be disposed in the pixel area PXA and the connection area CNA. In another embodiment, as shown in FIG. 4, the encapsulation layer 40 may be disposed in the pixel area PXA. An opening corresponding to the connection area CNA may be defined in the encapsulation layer 40. In other words, a portion of the encapsulation layer 40 that is disposed in the connection area CNA may be omitted.

In FIG. 3A, the pixel PX is covered by the encapsulation layer 40. However, in another embodiment, the pixel PX may be sealed by an encapsulation substrate.

The optical functional layer 50 may be disposed on the encapsulation layer 40. The optical functional layer 50 may include an anti-reflection layer. The anti-reflection layer may reduce reflectivity of light (external light) that is incident from an external source toward the display apparatus 1.

In some embodiments, the optical functional layer 50 may be a polarization film.

In some embodiments, the optical functional layer 50 may be implemented using a filter plate including a black matrix and color filters.

Although not shown in FIG. 3A, a touch screen layer may be between the encapsulation layer 40 and the optical functional layer 50. The touch screen layer may obtain coordinate information based on an external input, for example, a touch event. The touch screen layer may include a touch electrode and touch wires connected to the touch electrode. The touch screen layer may sense an external input according to a self-capacitance method or a mutual capacitance method.

The cover window 60 may be disposed on the optical functional layer 50. The cover window 60 may protect the display panel 10.

The cover window 60 may be a flexible window. The cover window 60 may protect the display panel 10 while being easily bent along an external force without generating cracks or the like. The cover window 60 may include glass, sapphire or plastic. In an embodiment, the cover window 60 may be ultra-thin glass (UTG™) or colorless polyimide ("CPI"), for example. In an embodiment, the cover window 60 may have a structure in which a flexible polymer layer is disposed on one surface of a glass substrate, or may include only a polymer layer.

When an external force is applied to the display apparatus 1 as shown in FIG. 3B (e.g., an external force is applied to the flexible substrate 30), the shapes and/or locations of some members of the display apparatus 1 may be changed. In an embodiment, when an external force is applied to the display apparatus 1, a distance between the pixel portions 10$a$ of the display panel 10 or a distance d between the pillar layers 20 may be reduced, for example. The connection portion 10$b$ of the display panel 10 may be bent and/or at least a portion of the encapsulation layer 40, at least a portion of the optical functional layer 50, and/or at least a portion of the cover window 60 may be bent.

As such, when an external force is applied to the display apparatus 1, the distance between the pixel portions 10$a$ of the display panel 10 or the distance d between the pillar layers 20 may be changed, and the shapes of the pixel portions 10$a$ of the display panel 10 and the shapes of the pillar layers 20 may not be changed. Accordingly, because the respective shapes of the pixel portion 10$a$ and the pillar layer 20 do not change, the pixel PX disposed in the pixel portion 10$a$ may be protected. While the pixel PX is being protected, the display apparatus 1 may be changed to have various shapes.

Figure 5:
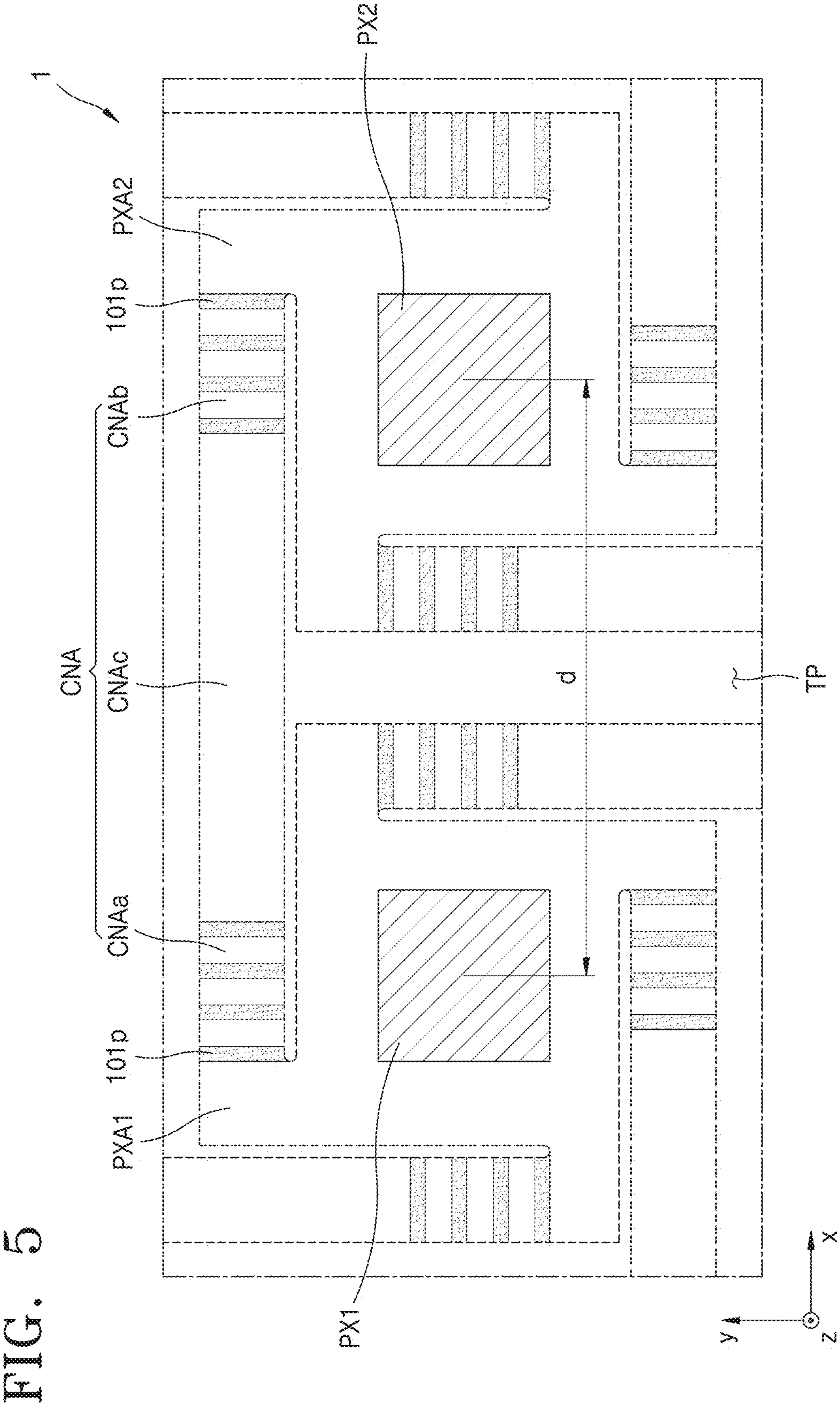
FIG. 5 is a schematic magnified plan view of an embodiment of a portion of a display apparatus.

FIG. 5 is a schematic magnified plan view of an embodiment of a portion of the display apparatus, and FIG. 6 is a schematic cross-sectional view of an embodiment of the display apparatus. Some members may be omitted. In an embodiment, FIG. 6 illustrates the display panel 10 of FIG. 3A. FIGS. 5 and 6 illustrate a first pixel area PXA1 and a second pixel area PXA2 from among the plurality of pixel areas PXA, and a first pixel PX1 and a second pixel PX2 from among the plurality of pixels PX, for example.

First, referring to FIG. 5, the display apparatus 1 may include the first pixel area PXA1, the second pixel area PXA2, the connection area CNA, the penetrating area TP, the first pixel PX1, and the second pixel PX2.

The first pixel area PXA1 and the second pixel area PXA2 may be spaced apart from each other, and may be connected to each other via the connection area CNA. The first pixel PX1 may be disposed in the first pixel area PXA1, and the second pixel PX2 may be disposed in the second pixel area PXA2.

Referring to FIG. 6, the display apparatus 1 may include a substrate 100. The substrate 100 may include a first base layer 101, a second base layer 103, and a barrier layer 105.

The first base layer 101 may include a first surface 101$a$ and a second surface 101$b$ opposite to each other. The first pixel PX1 disposed in the first pixel area PXA1 and the second pixel PX2 disposed in the second pixel area PXA2 may be arranged on the first surface 101$a$ of the first base layer 101.

The first base layer 101 may include a plurality of protrusions 101*p* arranged on the second surface 101*b* of the first base layer 101. The protrusions 101*p* of the first base layer 101 may be arranged in the connection area CNA.

The protrusions 101*p* of the first base layer 101 may extend in a width direction of the connection area CNA. In an embodiment, as shown in FIG. 5, the protrusions 101*p* arranged in the connection area CNA extending in the second direction (e.g., the ±x direction) may each extend in the first direction (e.g., the ±y direction), for example. On the contrary, the protrusions 101*p* arranged in the connection area CNA extending in the first direction (e.g., the ±y direction) may each extend in the second direction (e.g., the ±x direction).

FIGS. 5 and 6 illustrate that the protrusions 101*p* have the same widths. However, in another embodiment, the protrusions 101*p* may have different widths.

In an embodiment, the protrusions 101*p* of the first base layer 101 may be arranged on opposite ends of the connection area CNA. In an embodiment, as shown in FIGS. 5 and 6, the connection area CNA may include a first edge area CNAa, a second edge area CNAb, and a center area CNAc, for example. The first edge area CNAa may be disposed between the first pixel area PXA1 and the center area CNAc, and the second edge area CNAb may be located between the second pixel area PXA2 and the center area CNAc. In this case, the protrusions 101*p* of the first base layer 101 may be arranged in the first edge area CNAa and the second edge area CNAb.

When a separation distance d between the first pixel area PXA1 and the second pixel area PXA2 is reduced due to application of an external force to the display apparatus 1, opposite ends of the connection area CNA receive relatively greater strain than another portion of the connection area CNA. When the protrusions 101*p* of the first base layer 101 are arranged on opposite ends of the connection area CNA as in an embodiment, grooves gv between the protrusions 101*p* are defined, and thus strain received by opposite ends of the connection area CNA may decrease. Because the strain received by opposite ends of the connection area CNA decreases, a defect such as cutting or breakage of the connection area CNA due to the strain may be reduced.

The second base layer 103 may be disposed on the second surface 101*b* of the first base layer 101.

The second base layer 103 may not overlap the protrusions 101*p* of the first base layer 101 in a thickness direction (e.g., a ±z direction) of the second base layer 103. In an embodiment, when the protrusions 101*p* of the first base layer 101 are arranged in the first edge area CNAa and the second edge area CNAb as shown in FIG. 6, a portion of the second base layer 103 may be disposed in the first pixel area PXA1, another portion of the second base layer 103 may be disposed in the center area CNAc, and another portion of the second base layer 103 may be disposed in the second pixel area PXA2, for example.

A thickness t of the second base layer 103 may be substantially equal to a length l of each of the protrusions 101*p* in the thickness direction (e.g., the ±z direction) of the second base layer 103. A groove gv defined by adjacent protrusions 101*p* may be defined while a portion of the second base layer 103 is being removed. Because the grooves gv are defined by the protrusions 101*p*, a length of each of the grooves gv may be substantially equal to the length t of each of the protrusions 101*p*. Because the groove gv is defined while a portion of the second base layer 103 is being removed, the length of each of the grooves gv may be substantially equal to the thickness t of the second base layer 103. Accordingly, the length l of each of the protrusions 101*p* may be substantially equal to the thickness t of the second base layer 103.

The barrier layer 105 may be between the first base layer 101 and the second base layer 103. The barrier layer 105 may cover the protrusions 101*p* of the first base layer 101 differently from the second base layer 103. The barrier layer 105 may cover the second surface 101*b* of the first base layer 101, and may be disposed in the first pixel area PXA1, the connection area CNA, and the second pixel area PXA2.

Elements included in the display apparatus 1 will now be described in more detail according to a stacked structure with reference to FIG. 6. FIG. 6 illustrates the display apparatus 1, and some members may be omitted.

The substrate 100 may include a first base layer 101, a second base layer 103, and a barrier layer 105. The barrier layer 105 may be between the first base layer 101 and the second base layer 103.

At least one of the first base layer 101 and the second base layer 103 may include polymer resin such as polyethersulfone, polyacrylate, polyetherimide, polyethylene naphthalate, polyethylene terephthalate, polyphenylene sulfide, polyimide, polycarbonate, cellulose triacetate, or cellulose acetate propionate.

The barrier layer 105 may prevent or minimize infiltration of an external foreign material into a semiconductor layer Act or the like. The barrier layer 105 may be a single layer or multiple layers including an inorganic material such as a silicon nitride ($SiN_x$), a silicon oxide ($SiO_x$), and/or a silicon oxynitride (SiON).

The buffer layer 111 may be disposed on the first surface 101*a* of the first base layer 101. The buffer layer 111 may be disposed in the first pixel area PXA1 and the second pixel area PXA2. The buffer layer 111 may include an inorganic material (such as oxide or nitride), an organic material, or an organic and inorganic compound, and may be a single layer or multiple layers of an inorganic material and an organic material.

The pixel circuit PC may be disposed on the buffer layer 111. The pixel circuit PC may include at least one thin-film transistor TFT and one or more electrode layers E1 and E2. The thin-film transistor TFT may include the semiconductor layer Act and a gate electrode GE.

The semiconductor layer Act may be disposed on the buffer layer 111. The semiconductor layer Act may include amorphous silicon or polysilicon. In another embodiment, the semiconductor layer Act may include an oxide of at least one of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

The semiconductor layer Act may include a semiconductor region and a conductive region. The conductive region may be a region doped with impurities (dopant). The semiconductor layer Act may have a single-layer or multi-layer structure.

The gate electrode GE may be disposed on the semiconductor layer Act. The gate electrode GE may be provided such that at least a portion thereof overlaps the semiconductor layer Act. A region of the semiconductor layer Act that overlaps the gate electrode GE may be also referred to as a semiconductor region. The gate electrode GE may include, for example, molybdenum (Mo), aluminum (Al), copper (Cu), or titanium (Ti), and may have a single layer or multi-layer structure. In an embodiment, the gate electrode GE may be a single layer of Mo, for example.

The first electrode layer E1 and the second electrode layer E2 may be on the gate electrode GE. The first electrode layer E1 and the second electrode layer E2 may include a conductive material including molybdenum (Mo), aluminum (Al), copper (Cu), and titanium (Ti), and may be a multi-layer or single layer including the aforementioned materials. In an embodiment, the first electrode layer E1 and the second electrode layer E2 may each have a multi-layer structure including Ti/Al/Ti, for example.

The first electrode layer E1 and the second electrode layer E2 may be connected to the semiconductor layer Act. The first electrode layer E1 and the second electrode layer E2 may be connected to the semiconductor layer Act through contact holes defined in a gate insulating layer 113 and an inter-insulating layer 115, which are to be described below.

The gate insulating layer 113 may be between the semiconductor layer Act and the gate electrode GE. The gate insulating layer 113 may be disposed in the first pixel area PXA1 and the second pixel area PXA2. The gate insulating layer 113 may include a silicon oxide ($SiO_x$), a silicon nitride ($SiN_x$), a silicon oxynitride (SiON), an aluminum oxide ($Al_2O_3$), a titanium oxide ($TiO_2$), a tantalum oxide ($Ta_2O_5$), a hafnium oxide ($HfO_2$), a zinc oxide ($ZnO_x$), or the like. In a zinc oxide ($ZnO_x$), x may be a real number between 1 and 2. In an embodiment, x may be 1 or 2. In other words, a zinc oxide ($ZnO_x$) may be a zinc oxide (ZnO) and/or a zinc peroxide ($ZnO_2$), for example.

The inter-insulating layer 115 may be between the gate electrode GE and the first and second electrode layers E1 and E2. The inter-insulating layer 115 may be disposed in the first pixel area PXA1 and the second pixel area PXA2. The inter-insulating layer 115 may include a silicon oxide ($SiO_x$), a silicon nitride ($SiN_x$), a silicon oxynitride (SiON), an aluminum oxide ($Al_2O_3$), a titanium oxide ($TiO_2$), a tantalum oxide ($Ta_2O_5$), a hafnium oxide ($HfO_2$), a zinc oxide ($ZnO_x$), or the like. In a zinc oxide ($ZnO_x$), x may be a real number between 1 and 2. In an embodiment, x may be 1 or 2. In other words, a zinc oxide ($ZnO_x$) may be a zinc oxide (ZnO) and/or a zinc peroxide ($ZnO_2$), for example.

The first electrode layer E1 and the second electrode layer E2 may be covered by an inorganic protective layer (not shown). The inorganic protective layer may be a single layer or multi-layer of a silicon nitride ($SiN_x$) and a silicon oxide ($SiO_x$). The inorganic protective layer may be employed to cover and protect some wires arranged on the inter-insulating layer 115.

A wiring portion WP may be disposed on the substrate 100. The wiring portion WP may connect the first pixel PX1 and the second pixel PX2 respectively arranged in the first pixel area PXA1 and the second pixel area PXA2 adjacent to each other, via the connection area CNA. The wiring portion WP may include at least one of the scan line SL, the data line DL, and the power line PL of FIG. 2.

Because the buffer layer 111, the gate insulating layer 113, and the inter-insulating layer 115 are not arranged in the connection area CNA, the wiring portion WP may have a recessed shape in the connection area CNA. A portion of the wiring portion WP overlapping the connection area CNA may directly contact the substrate 100.

The wiring portion WP may include a first line LI1 overlapping the first pixel area PXA1 and the second pixel area PXA2, and a second line LI2 bridge-connected to the first line LI1 via a contact hole of the inter-insulating layer 115 and overlapping the connection area CNA. The first line LI1 may be disposed in the same layer as the layer in which the gate electrode GE is disposed, and may include the same material as that of the gate electrode GE. The second line LI2 may be disposed in the same layer as the layer in which the first electrode layer E1 and the second electrode layer E2 are disposed, and may include the same material as that of the first electrode layer E1 and the second electrode layer E2.

In FIG. 6, the first line LI1 and the second line LI2 are arranged in different layers. However, in another embodiment, the first line LI1 and the second line LI2 may be arranged in the same layer. In an embodiment, the first line LI1 and the second line LI2 may be unitary with each other and may be arranged on the gate insulating layer 113 or the inter-insulating layer 115, for example.

A planarization layer 117 may be disposed to cover the first electrode layer E1, the second electrode layer E2, and the wiring portion WP. Contact holes for connecting the pixel circuit PC to the display element DE may be defined in the planarization layer 117. The planarization layer 117 may be disposed in the first pixel area PXA1, the second pixel area PXA2, and the connection area CNA.

The planarization layer 117 may have a single-layer or multi-layer structure of a layer including an organic material, and provides a flat upper surface. The planarization layer 117 may include a commercial polymer such as benzocyclobutene ("BCB"), polyimide, hexamethyldisiloxane ("HMDSO"), polymethyl methacrylate ("PMMA") or polystyrene ("PS"), a polymer derivative having a phenol-based group, an acrylic-based polymer, an imide-based polymer, an acryl ether-based polymer, an amide-based polymer, a fluorine-based polymer, a p-xylene-based polymer, a vinyl alcohol-based polymer, any combinations thereof, or the like.

The display element DE may be disposed on the planarization layer 117. The display element DE may include a pixel electrode 210, an intermediate layer 220 including an organic emission layer, and an opposite electrode 230. The display element DE may be connected to the pixel circuit PC through the contact hole defined in the planarization layer 117.

The pixel electrode 210 may be a (semi) light-transmissive electrode or a reflective electrode. In some embodiments, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any combinations thereof, and a transparent or semi-transparent electrode layer formed or disposed on the reflective layer. The transparent or semi-transparent electrode layer may include at least one of an indium tin oxide (ITO), an indium zinc oxide ("IZO"), a zinc oxide (ZnO), an indium oxide ($In_3O_3$), an indium gallium oxide ("IGO"), and an aluminum zinc oxide ("AZO"). In some embodiments, the pixel electrode 210 may be formed or provided as ITO/Ag/ITO.

A pixel defining layer 119 may be disposed on the planarization layer 117 in a display area of the substrate 100. The pixel defining layer 119 may cover an edge of the pixel electrode 210, and an opening that exposes a center portion of the pixel electrode 210 may be defined in the pixel defining layer 119. The opening may define an emission region of the display element DE. The pixel defining layer 119 may be disposed in the first pixel area PXA1 and the second pixel area PXA2.

The pixel defining layer 119 may prevent an electric arc or the like from occurring on the edge of the pixel electrode 210 by increasing a distance between the edge of the pixel electrode 210 and the opposite electrode 230 that is over the pixel electrode 210.

The pixel defining layer 119 may include at least one organic insulating material including at least one of polyimide, polyamide, acrylic resin, BCB, and a phenolic resin. In an alternative embodiment, the pixel defining layer 119 may include an inorganic insulating material such as a silicon oxide ($SiO_x$), a silicon nitride ($SiN_x$), or a silicon oxynitride ($SiO_xN_y$). In an alternative embodiment, the pixel defining layer 119 may include an organic insulating material and an inorganic insulating material. In some embodiments, the pixel defining layer 119 may include a light shielding material, and may have a black color. The light shielding material may include carbon black, carbon nanotubes, resin or paste including a black pigment, metal particles (e.g., nickel, aluminum, molybdenum, and an alloy thereof), metal oxide particles (e.g., a chromium oxide), or metal nitride particles (e.g., a chromium nitride). When the pixel defining layer 119 includes the light shielding material, external light reflection due to metal structures arranged under the pixel defining layer 119 may be reduced.

The intermediate layer 220 may be disposed in the opening defined in the pixel defining layer 119 and may include an organic emission layer. The organic emission layer may include an organic material including a fluorescent or phosphorescent material that emits red, green, or blue light. The organic emission layer may include a low molecular organic material or a high molecular organic material, and functional layer, such as a hole transport layer ("HTL"), a hole injection layer ("HIL"), an electron transport layer ("ETL"), or an electron injection layer ("EIL"), may be further arranged below and above the organic emission layer.

The opposite electrode 230 may be a light-transmissive electrode or a reflective electrode. In some embodiments, the opposite electrode 230 may be a transparent or semi-transparent electrode, and may include a metal thin film having a small work function, including lithium (Li), calcium (Ca), lithium fluoride/calcium (LiF/Ca), lithium fluoride/aluminum (LiF/Al), aluminum (Al), silver (Ag), magnesium (Mg), or any combinations thereof. A transparent conductive oxide ("TCO") layer including, for example, ITO, IZO, ZnO, or $In_2O_3$, may be further disposed on the metal thin film. The opposite electrode 230 may extend over the display area, and may be disposed on the intermediate layer 220 and the pixel defining layer 119. The opposite electrode 230 may be formed or provided as a single body constituting a plurality of display elements DE, and thus may correspond to a plurality of pixel electrodes 210.

Because the display elements DE may be easily damaged by external moisture, oxygen, or the like, an encapsulation layer (not shown) may cover and protect the display elements DE. The encapsulation layer may cover the display area, and may extend to at least a portion of a peripheral area. The encapsulation layer may include at least one inorganic encapsulation layer.

Figure 7:
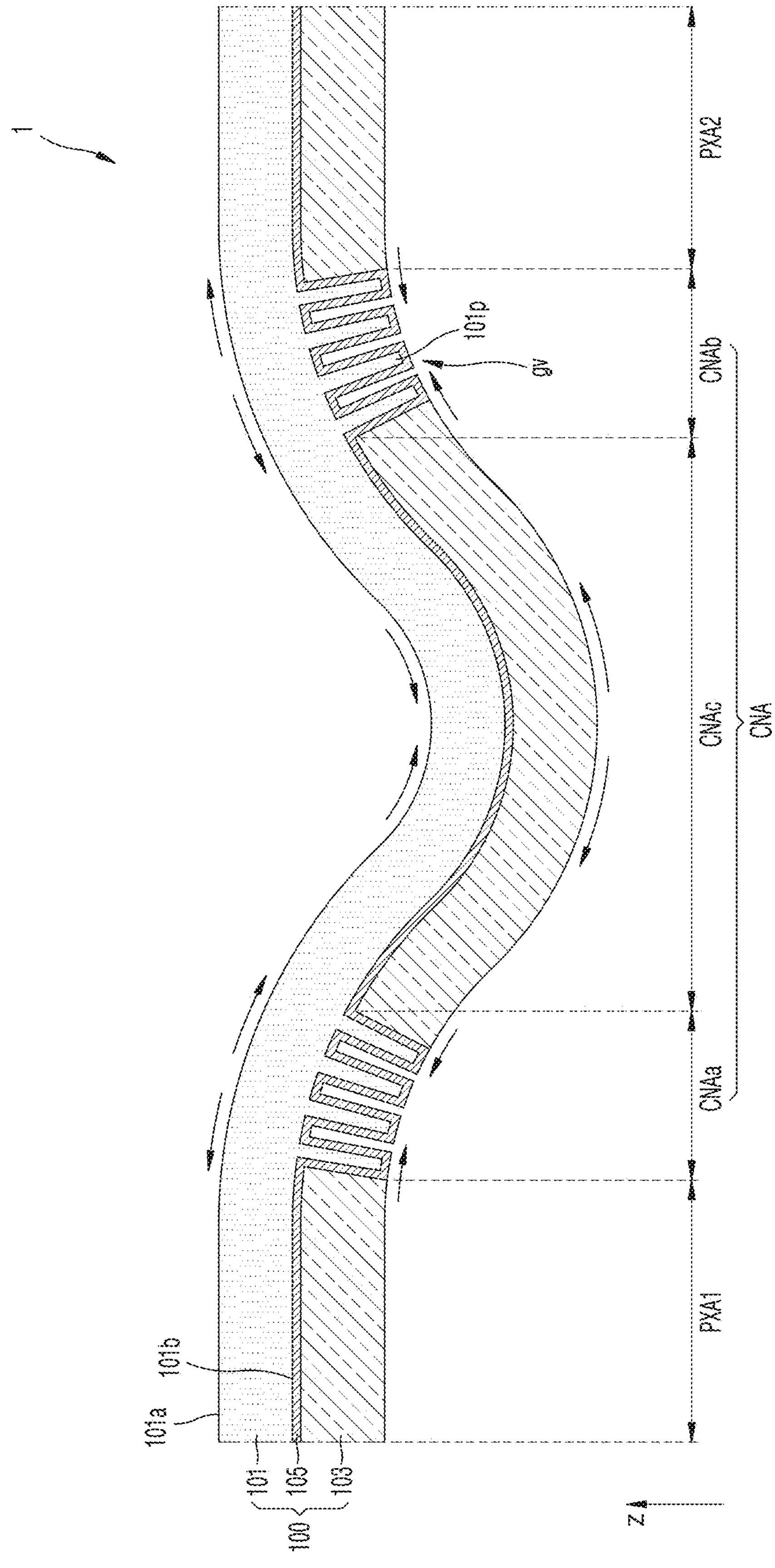
FIG. 7 is a cross-sectional view illustrating an embodiment of a case where an external force has been applied to a display apparatus.

FIG. 7 is a cross-sectional view illustrating an embodiment of a case where an external force has been applied to a display apparatus; FIG. 7 illustrates the substrate 100 of FIG. 6.

Referring to FIG. 7, when the separation distance d (refer to FIG. 5) between the first pixel area PXA1 and the second pixel area PXA2 is reduced due to application of an external force to the display apparatus 1, the connection area CNA may be bent or curved by the external force. At this time, opposite ends (e.g., the first edge area CNAa and the second edge area CNAb) of the connection area CNA receive relatively greater strain than the other portion of the connection area CNA.

When the protrusions 101*p* of the first base layer 101 are arranged on opposite ends of the connection area CNA as in an embodiment, grooves gv are defined due to the protrusions 101*p*, and thus strain received by opposite ends of the connection area CNA may decrease. Because the strain received by opposite ends of the connection area CNA decreases, a defect such as cutting or breakage of the connection area CNA due to the strain may be reduced.

When the protrusions 101*p* of the first base layer 101 are arranged on opposite ends of the connection area CNA, stretching may be induced in portions of an upper surface (i.e., the first surface 101*a* of the first base layer 101) of the substrate 100 that correspond to the first edge area CNAa and the second edge area CNAb, and contraction may be induced in portions of a lower surface of the substrate 100 that correspond to the first edge area CNAa and the second edge area CNAb. Contraction may be induced in a portion of the upper surface of the substrate 100 that corresponds to the center portion of the connection area CNA, and stretching may be induced in a portion of the lower surface of the substrate 100 that corresponds to the center portion of the connection area CNA. The connection area CNA may be bent or curved in the −z direction. The connection area CNA may be located in the −z direction, based on the upper surface of the substrate 100.

When the connection area CNA is located in the +z direction, based on the upper surface of the substrate 100, pressure applied when an upper member such as a window is attached to the upper surface of the substrate 100 affects the protruding connection area CNA, and thus a defect such as cutting or breakage of the connection area CNA may be generated.

When the protrusions 101*p* of the first base layer 101 are arranged on opposite ends of the connection area CNA as in an embodiment and the connection area CNA is inducted to be bent or curved in the −z direction, the pressure applied when the upper member such as a window is attached to the upper surface of the substrate 100 does not affect the connection area CNA, and thus occurrence of a defect such as cutting or breakage of the connection area CNA may be reduced.

FIG. 7 illustrates that the protrusions 101*p* of the first base layer 101 are arranged on opposite ends of the connection area CNA and the connection area CNA is inducted to be bent or curved in the −z direction. However, the shape of the connection area CNA that is deformed by an external force may be controlled by adjusting the locations of the protrusions 101*p* of the first base layer 101. Due to the adjustment of the locations of the protrusions 101*p* of the first base layer 101, a direction in which the connection area CNA is bent may be controlled.

In an embodiment, the protrusions 101*p* may be arranged in correspondence with a portion receiving great strain within the connection area CNA desired to be deformed during generation of an external force, for example. The portion receiving great strain may be predicted through a simulation or the like.

Figure 8:
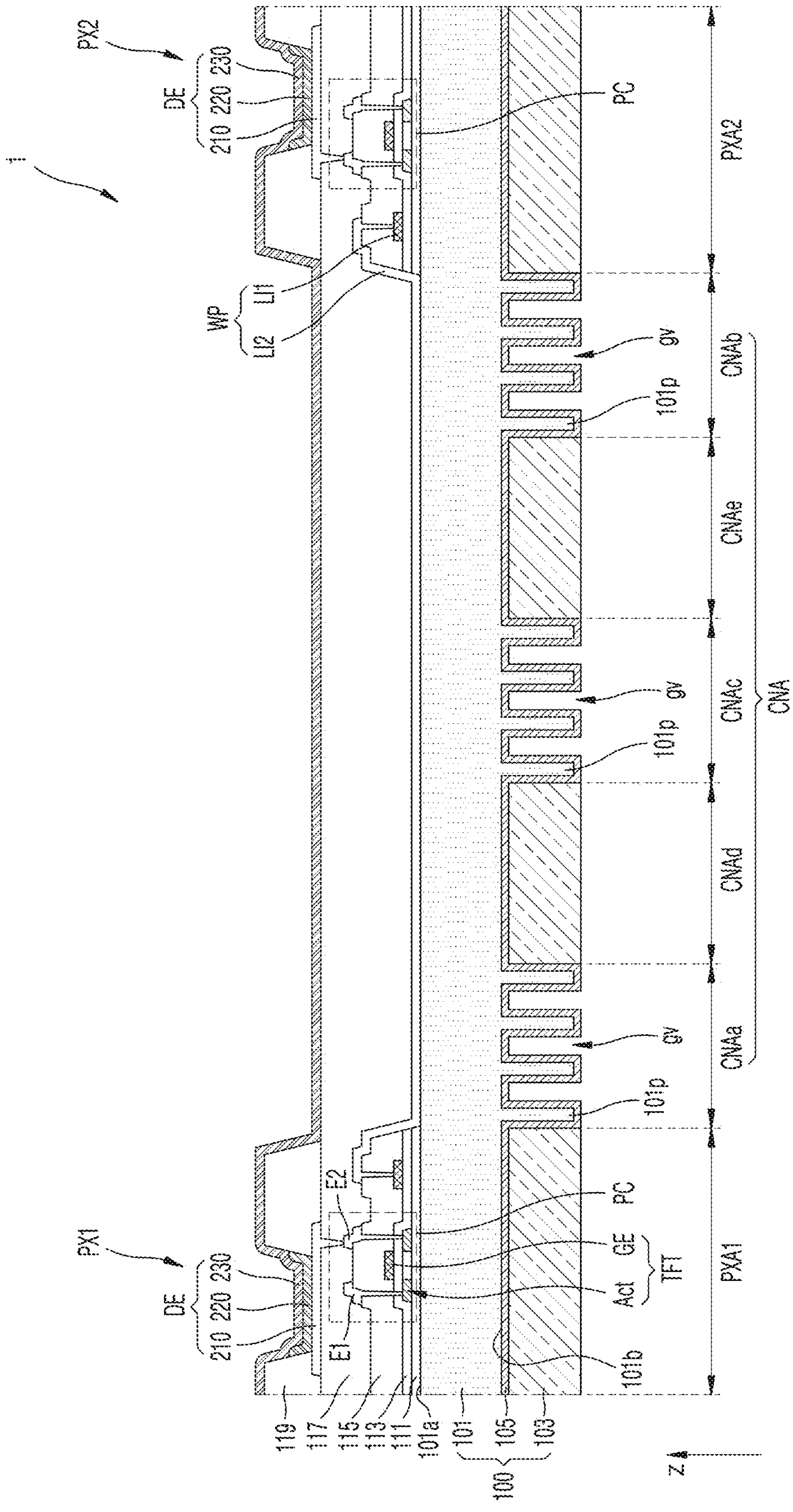
FIG. 8 is a schematic cross-sectional view of an embodiment of a display apparatus.

FIG. 8 is a schematic cross-sectional view of an embodiment of a display apparatus. FIG. 8 is a modification of FIG. 6, and is thus different therefrom in the structure of protrusions. Hereinafter, overlapping contents therebetween will be replaced with the description of FIG. 6, and the differences will be mainly described.

Referring to FIG. 8, the connection area CNA may include a first edge area CNAa, a second edge area CNAb, a center area CNAc, a first area CNAd, and a second area CNAe.

The first edge area CNAa may be located between the first pixel area PXA1 and the center area CNAc, and the second edge area CNAb may be located between the second pixel area PXA2 and the center area CNAc. The first area CNAd may be located between the first edge area CNAa and the center area CNAc, and the second area CNAe may be located between the second edge area CNAb and the center area CNAc.

In an embodiment, the protrusions 101*p* of the first base layer 101 may be arranged in at least one of the first edge area CNAa, the second edge area CNAb, and the center area CNAc. In an embodiment, as shown in FIG. 8, the protrusions 101*p* of the first base layer 101 may be arranged in the first edge area CNAa, the second edge area CNAb, and the center area CNAc, for example.

Because the protrusions 101*p* of the first base layer 101 are arranged in at least one of the first edge area CNAa, the second edge area CNAb, and the center area CNAc receiving relatively great strain when an external force is applied to the display apparatus 1, occurrence of a defect such as cutting or breaking of the connection area CNA may be reduced.

Moreover, when the protrusions 101*p* of the first base layer 101 are arranged in the first edge area CNAa, the second edge area CNAb, and the center area CNAc, stretching may be induced in portions of the upper surface (i.e., the first surface 101*a* of the first base layer 101) of the substrate 100 that correspond to the first edge area CNAa and the second edge area CNAb, and contraction may be induced in portions of the lower surface of the substrate 100 that correspond to the first edge area CNAa and the second edge area CNAb. Contraction may be induced in a portion of the upper surface of the substrate 100 that corresponds to the center area CNAc of the connection area CNA, and stretching may be induced in a portion of the lower surface of the substrate 100 that corresponds to the center area CNAc of the connection area CNA. The connection area CNA may be bent or curved in the −z direction. The connection area CNA may be located in the −z direction, based on the upper surface of the substrate 100. When the connection area CNA is inducted to be bent or curved in the −z direction, pressure applied during a subsequent process is not delivered to the connection area CNA, and thus occurrence of a defect such as cutting or breaking of the connection area CNA may be reduced.

Figure 9:
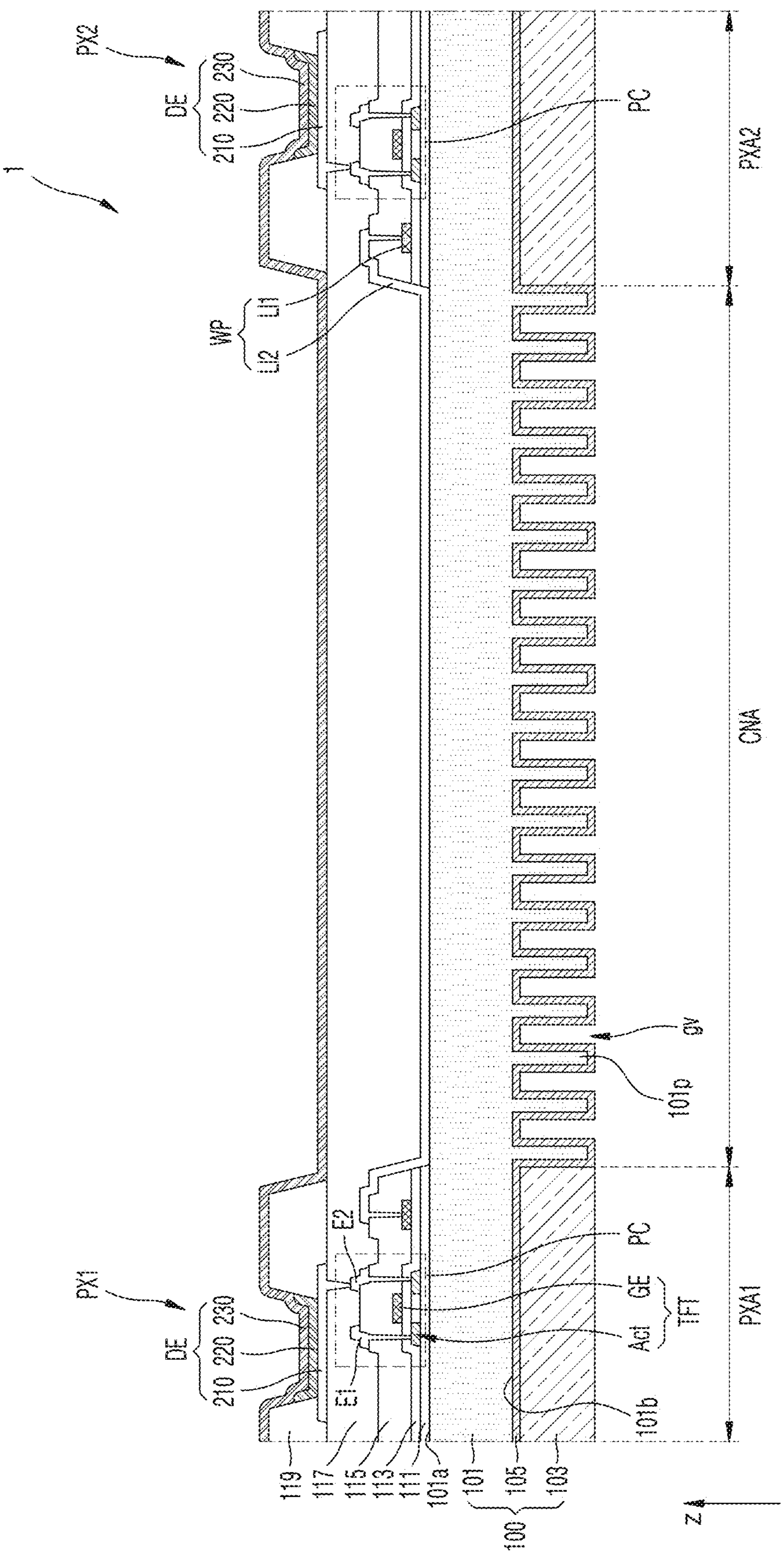
FIG. 9 is a schematic cross-sectional view of an embodiment of a display apparatus.

FIG. 9 is a schematic cross-sectional view of an embodiment of a display apparatus. FIG. 9 is a modification of FIG. 6, and is thus different therefrom in the structure of protrusions. Hereinafter, overlapping contents therebetween will be replaced with the description of FIG. 6, and the differences will be mainly described.

Referring to FIG. 9, in contrast with FIGS. 6 and 8, the protrusions 101*p* of the first base layer 101 may be arranged throughout the entire area of the connection area CNA. In other words, the grooves gv defined by the protrusions 101*p* of the first base layer 101 may be arranged throughout the entire area of the connection area CNA.

The grooves gv may reduce the weight of the display apparatus 1 and improve the flexibility of the display apparatus 1. When an external force (such as, a bending force, a curving force, a pulling force, or a pushing force) is applied to the display apparatus 1, the shape of each of the grooves gv may be changed, thereby easily reducing occurrence of stress during deformation of the display apparatus 1. Through the grooves gv, abnormal deformation of the display apparatus 1 may be prevented, and the durability of the display apparatus 1 may be improved.

Figure 10:
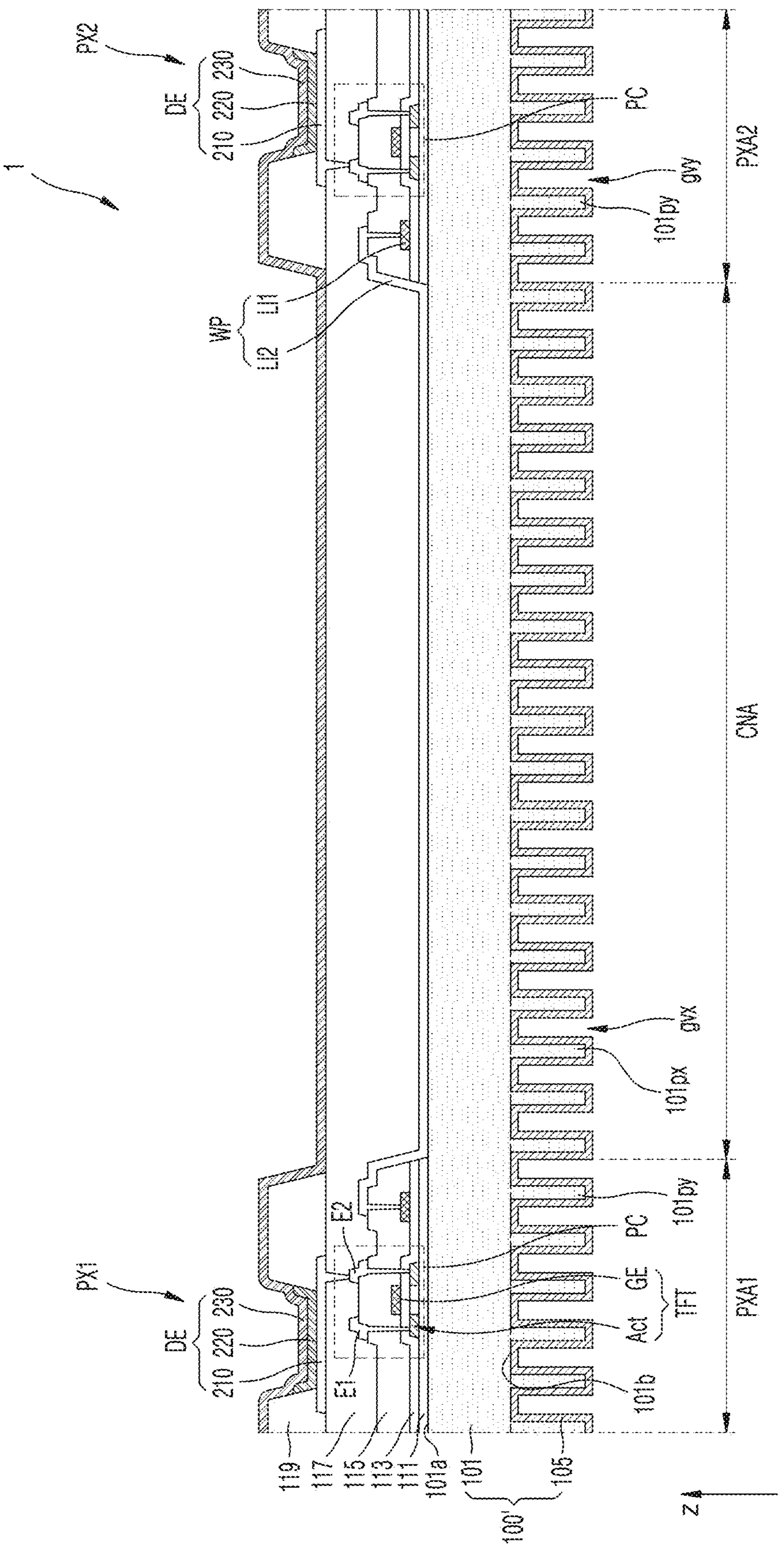
FIG. 10 is a schematic cross-sectional view of another embodiment of a display apparatus.

FIG. 10 is a schematic cross-sectional view of another embodiment of a display apparatus. FIG. 10 is a modification of FIG. 6, and is thus different therefrom in the structure of a substrate. Hereinafter, overlapping contents therebetween will be replaced with the description of FIG. 6, and the differences will be mainly described.

Referring to FIG. 10, a substrate 100' may include a first base layer 101 and a barrier layer 105. In contrast with FIG. 6, the second base layer 103 may be omitted.

The first base layer 101 may include a first surface 101*a* and a second surface 101*b* opposite to each other. The first pixel PX1 disposed in the first pixel area PXA1 and the second pixel PX2 disposed in the second pixel area PXA2 may be arranged on the first surface 101*a* of the first base layer 101.

The first base layer 101 may include a plurality of first protrusions 101*px* and a plurality of second protrusions 101*py* arranged on the second surface 101*b* of the first base layer 101. The first protrusions 101*px* may correspond to the protrusions 101*p* of FIG. 6.

The first protrusions 101*px* of the first base layer 101 may be arranged in the connection area CNA, and the second protrusion 101*py* of the first base layer 101 may be arranged in the first pixel area PXA1 and the second pixel area PXA2.

In other words, first groove gvx defined by the first protrusions 101*px* of the first base layer 101 may be arranged in the connection area CNA, and second grooves gvy defined by the second protrusion 101*py* of the first base layer 101 may be arranged in the first pixel area PXA1 and the second pixel area PXA2. The first groove gvx and the second grooves gvy may reduce the weight of the display apparatus 1 and improve the flexibility of the display apparatus 1.

Figure 11:
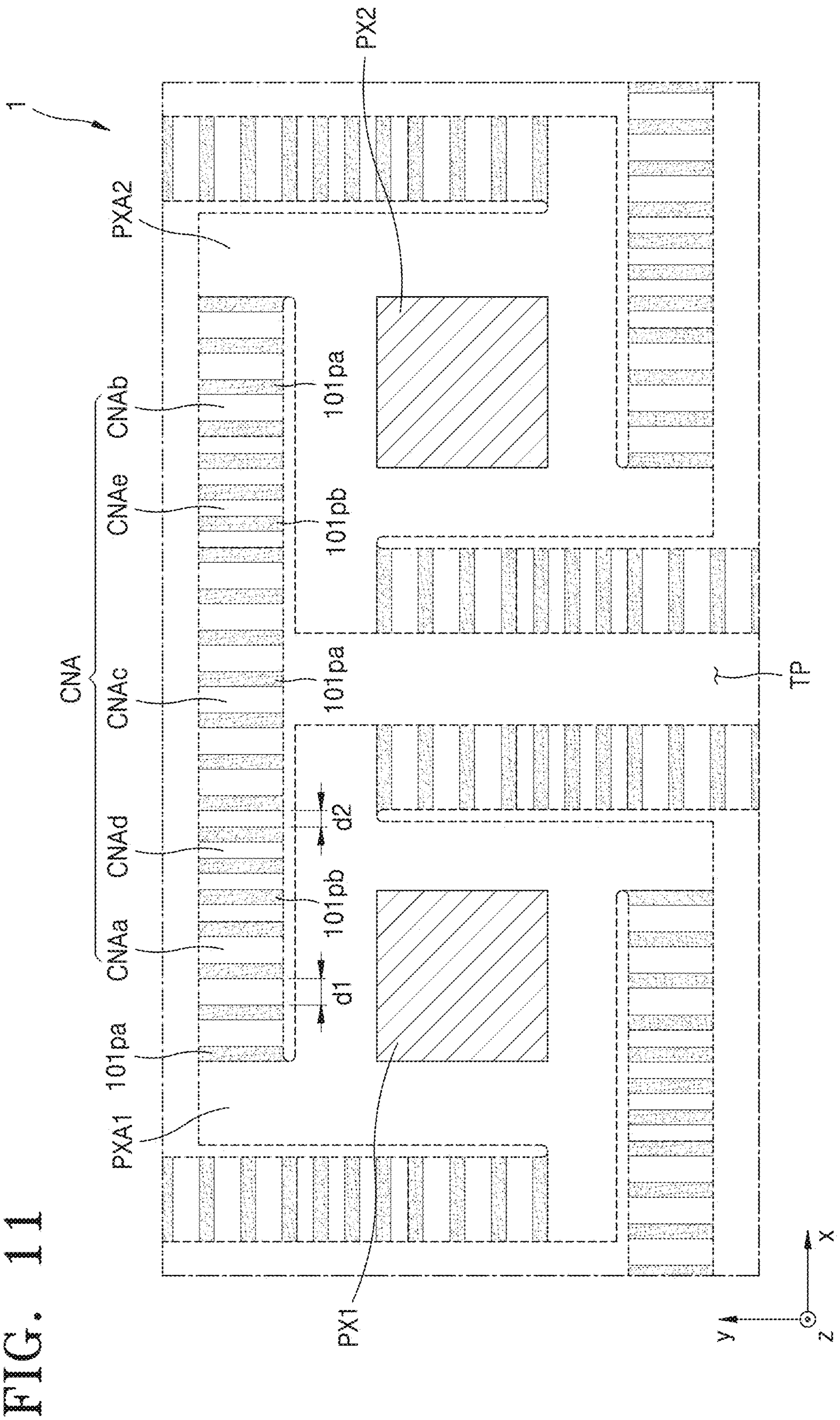
FIG. 11 is a schematic magnified plan view of an embodiment of a portion of a display apparatus.
Figure 12:
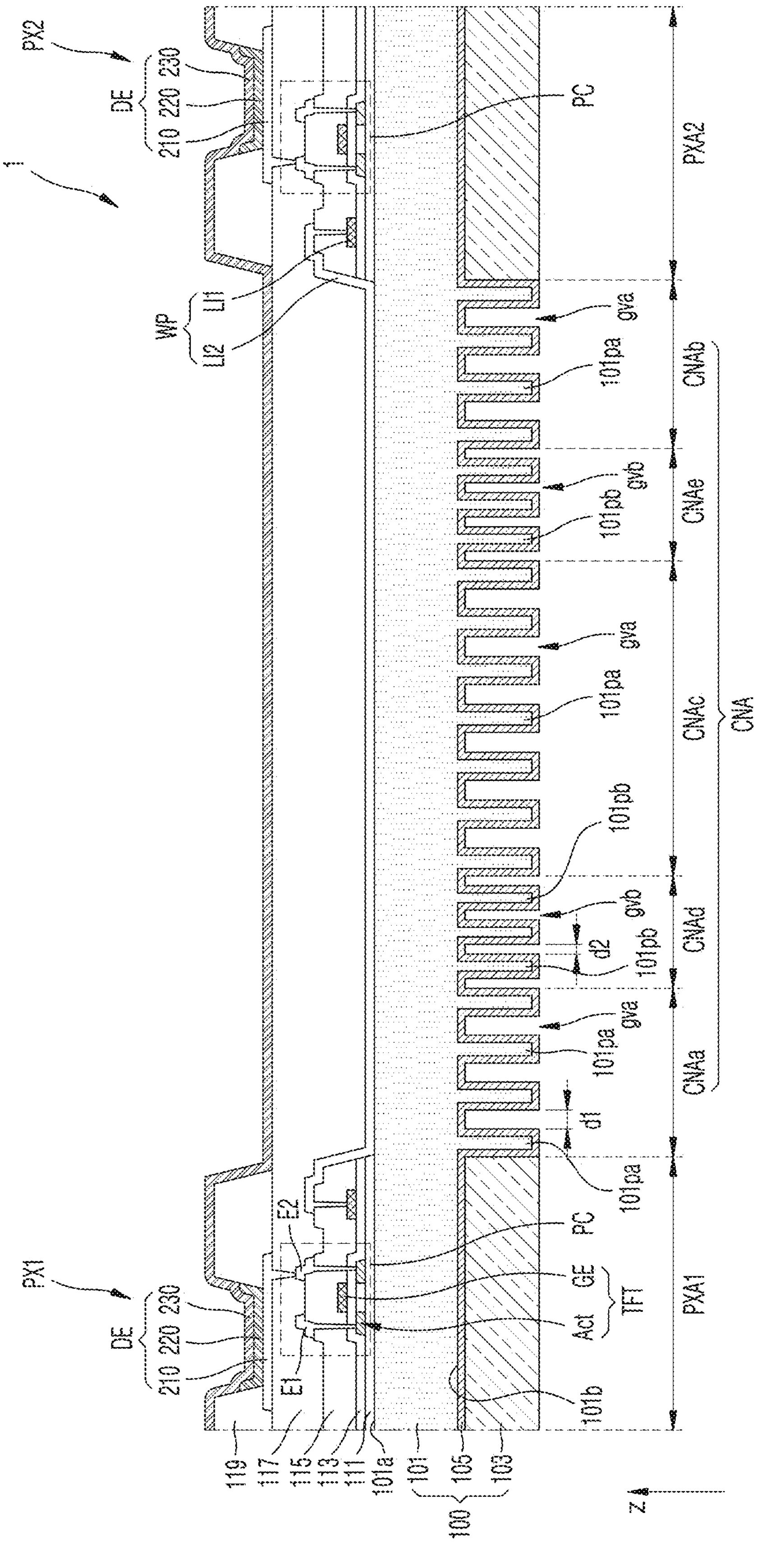
FIG. 12 is a schematic cross-sectional view of an embodiment of a display apparatus.

FIG. 11 is a schematic magnified plan view of an embodiment of a portion of a display apparatus, and FIG. 12 is a schematic cross-sectional view of an embodiment of a display apparatus. FIGS. 11 and 12 correspond to a modification of FIGS. 5 and 6, and thus are different from FIGS. 5 and 6 in the structure of protrusions. Hereinafter, overlapping contents therebetween will be replaced with the description of FIGS. 5 and 6, and the differences will be mainly described.

First, referring to FIG. 11, a display apparatus 1 may include the first pixel area PXA1, the second pixel area PXA2, the connection area CNA, the penetrating area TP, the first pixel PX1, and the second pixel PX2.

The first pixel area PXA1 and the second pixel area PXA2 may be spaced apart from each other, and may extend to each other via the connection area CNA. The first pixel PX1 may be disposed in the first pixel area PXA1, and the second pixel PX2 may be disposed in the second pixel area PXA2.

The connection area CNA may include the first edge area CNAa, the second edge area CNAb, the center area CNAc, the first area CNAd, and the second area CNAe. The first edge area CNAa may be located between the first pixel area PXA1 and the center area CNAc, and the second edge area CNAb may be located between the second pixel area PXA2 and the center area CNAc. The first area CNAd may be located between the first edge area CNAa and the center area CNAc, and the second area CNAe may be located between the second edge area CNAb and the center area CNAc.

Referring to FIG. 12, the display apparatus 1 may include a substrate 100. The substrate 100 may include a first base layer 101, a second base layer 103, and a barrier layer 105.

The first base layer 101 may include a first surface 101*a* and a second surface 101*b* opposite to each other. The first pixel PX1 disposed in the first pixel area PXA1 and the second pixel PX2 disposed in the second pixel area PXA2 may be arranged on the first surface 101*a* of the first base layer 101.

The first base layer 101 may include a plurality of first protrusions 101*pa* and a plurality of second protrusions 101*pb* arranged on the second surface 101*b* of the first base layer 101. The plurality of first protrusions 101*pa* and the plurality of second protrusions 101*pb* may be arranged in the connection area CNA, and may extend in the width direction of the connection area CNA. In an embodiment, as shown in FIG. 11, the first protrusions 101*pa* and the second protrusions 101*pb* arranged in the connection area CNA extending in the second direction (e.g., the ±x direction) may each extend in the first direction (e.g., the ±y direction), for example. On the contrary, the first protrusions 101*pa* and the second protrusions 101*pb* arranged in the connection area CNA extending in the first direction (e.g., the ±y direction) may each extend in the second direction (e.g., the ±x direction).

In FIG. 11, a width of each of the first protrusions 101*pa* is equal to that of each of the second protrusions 101*pb*. However, in another embodiment, the width of each of the first protrusions 101*pa* may be different from that of each of the second protrusions 101*pb*. In another embodiment, the first protrusions 101*pa* may have different widths, or the second protrusions 101*pb* may have different widths.

In an embodiment, the first protrusions 101*pa* of the first base layer 101 may be arranged in the first edge area CNAa, the second edge area CNAb, and the center area CNAc, and the second protrusions 101*pb* of the first base layer 101 may be arranged in the first area CNAd and the second area CNAe.

A first distance d1 between adjacent first protrusions 101*pa* from among the plurality of first protrusions 101*pa* may be different from a second distance d2 between adjacent second protrusions 101*pb* from among the plurality of second protrusions 101*pb*. In an embodiment, as shown in FIGS. 11 and 12, the first distance d1 may be greater than the second distance d2, for example.

In other words, respective widths of first grooves gva defined by the first protrusions 101*pa* may be different from respective widths of second grooves gvb defined by the second protrusions 101*pb*. In an embodiment, the respective widths of the first grooves gva may be greater than those of the second groove gvb, for example.

In an embodiment, a distance between protrusions may be adjusted based on strain received by the connection area CNA when an external force is applied to the display apparatus 1. In other words, the respective widths of grooves defined in the first base layer 101 may be adjusted based on the strain received by the connection area CNA when an external force is applied to the display apparatus 1.

In an embodiment, the first distance d1 between the first protrusions 101*pa* arranged in the first edge area CNAa, the second edge area CNAb, and the center area CNAc receiving relatively great strain when an external force is applied to the connection area CNA may be greater than the second distance d2 between the second protrusions 101*pb* arranged in the first area CNAd and the second area CNAe, for example.

In other words, a width of each of the first grooves gva defined in the first edge area CNAa, the second edge area CNAb, and the center area CNAc receiving relatively great strain when an external force is applied to the connection area CNA may be greater than that of each of the second grooves gvb defined in the first area CNAd and the second area CNAe.

Figure 13:
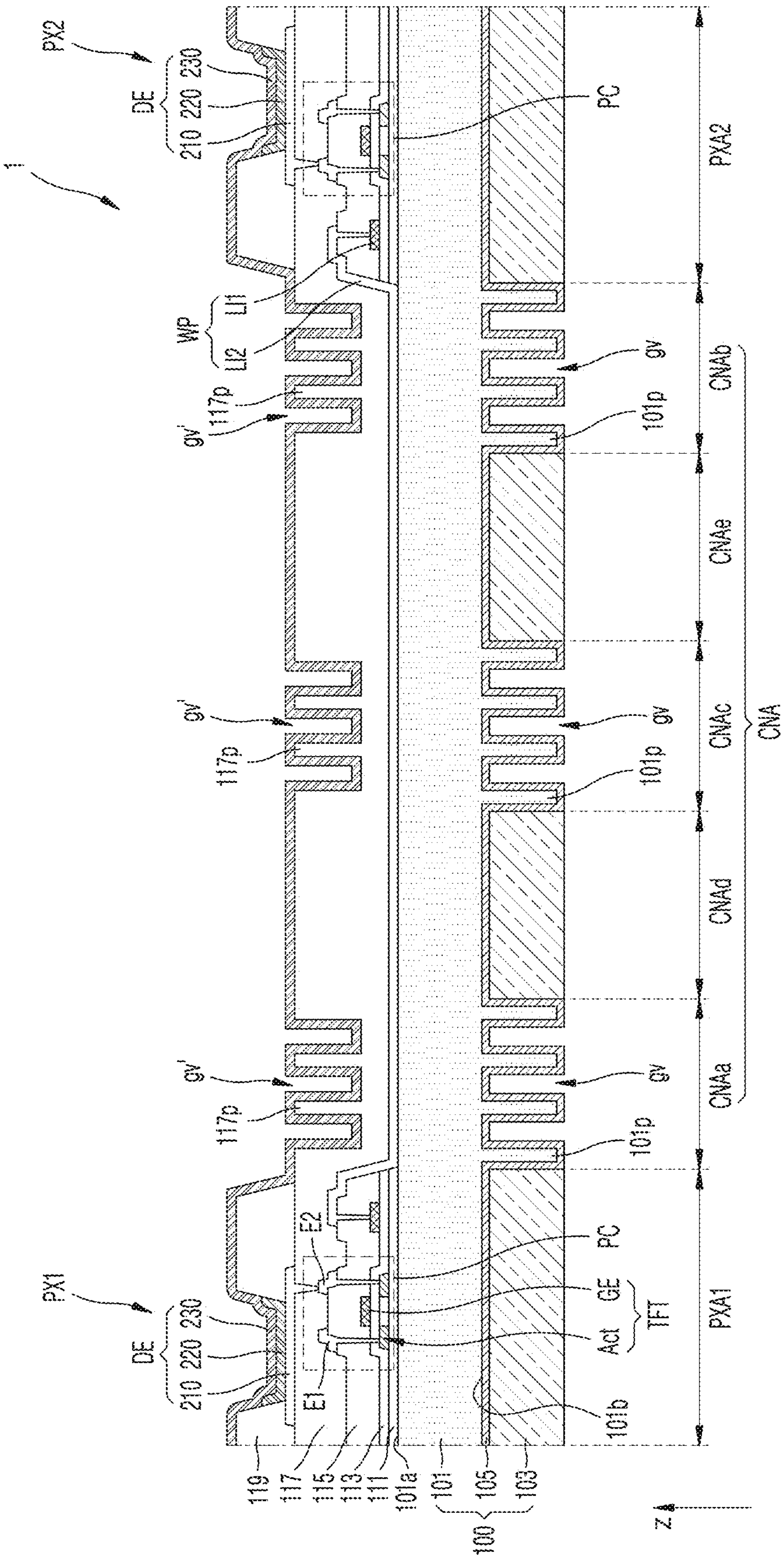
FIG. 13 is a schematic cross-sectional view of an embodiment of a display apparatus.

FIG. 13 is a schematic cross-sectional view of an embodiment of a display apparatus; FIG. 13 is a modification of FIG. 8, and is thus different therefrom in the structure of a planarization layer. Hereinafter, overlapping contents therebetween will be replaced with the description of FIG. 8, and the differences will be mainly described.

Referring to FIG. 13, in contrast with FIG. 8, a plurality of grooves gv' may be defined in the planarization layer 117 between the pixel circuit PC and the display element DE. The planarization layer 117 may include a plurality of insulating patterns 117*p* each protruding in the +z direction, and the plurality of grooves gv' may be defined by the plurality of insulating patterns 117*p*. The insulating patterns 117*p* of the planarization layer 117 may be formed or provided using a halftone mask.

The plurality of grooves gv' may be arranged in the connection area CNA. In an embodiment, the grooves gv' may be arranged in at least one of the first edge area CNAa, the second edge area CNAb, and the center area CNAc, for example.

Similar to the protrusions 101*p* of the first base layer 101, the plurality of grooves gv' may extend in the width direction of the connection area CNA. In an embodiment, as shown in FIG. 5, the grooves gv' defined in the connection area CNA extending in the second direction (e.g., the ±x direction) may each extend in the first direction (e.g., the ±y direction), for example. On the contrary, the grooves gv' defined in the connection area CNA extending in the first direction (e.g., the ±y direction) may each extend in the second direction (e.g., the ±x direction).

The grooves gv' may reduce the weight of the display apparatus 1 and improve the flexibility of the display apparatus 1. When an external force (such as, a bending force, a curving force, a pulling force, or a pushing force) is applied to the display apparatus 1, the shape of each of the grooves gv' may be changed, thereby easily reducing occurrence of stress during deformation of the display apparatus 1. Through the grooves gv', abnormal deformation of the display apparatus 1 may be prevented, and the durability of the display apparatus 1 may be improved.

In FIG. 13, the grooves gv' are arranged in the first edge area CNAa, the second edge area CNAb, and the center area CNAc. However, in another embodiment, the grooves gv' may be arranged only in the first edge area CNAa and the second edge area CNAb. In another embodiment, the grooves gv' may be arranged in the first area CNAd and the second area CNAe.

In FIG. 13, the first base layer 101 includes the protrusions 101*p* arranged in the first edge area CNAa, the second edge area CNAb, and the center area CNAc. However, in another embodiment, the first base layer 101 may include the protrusions of one of FIGS. 6, 9, 10, and 12.

Figure 14:
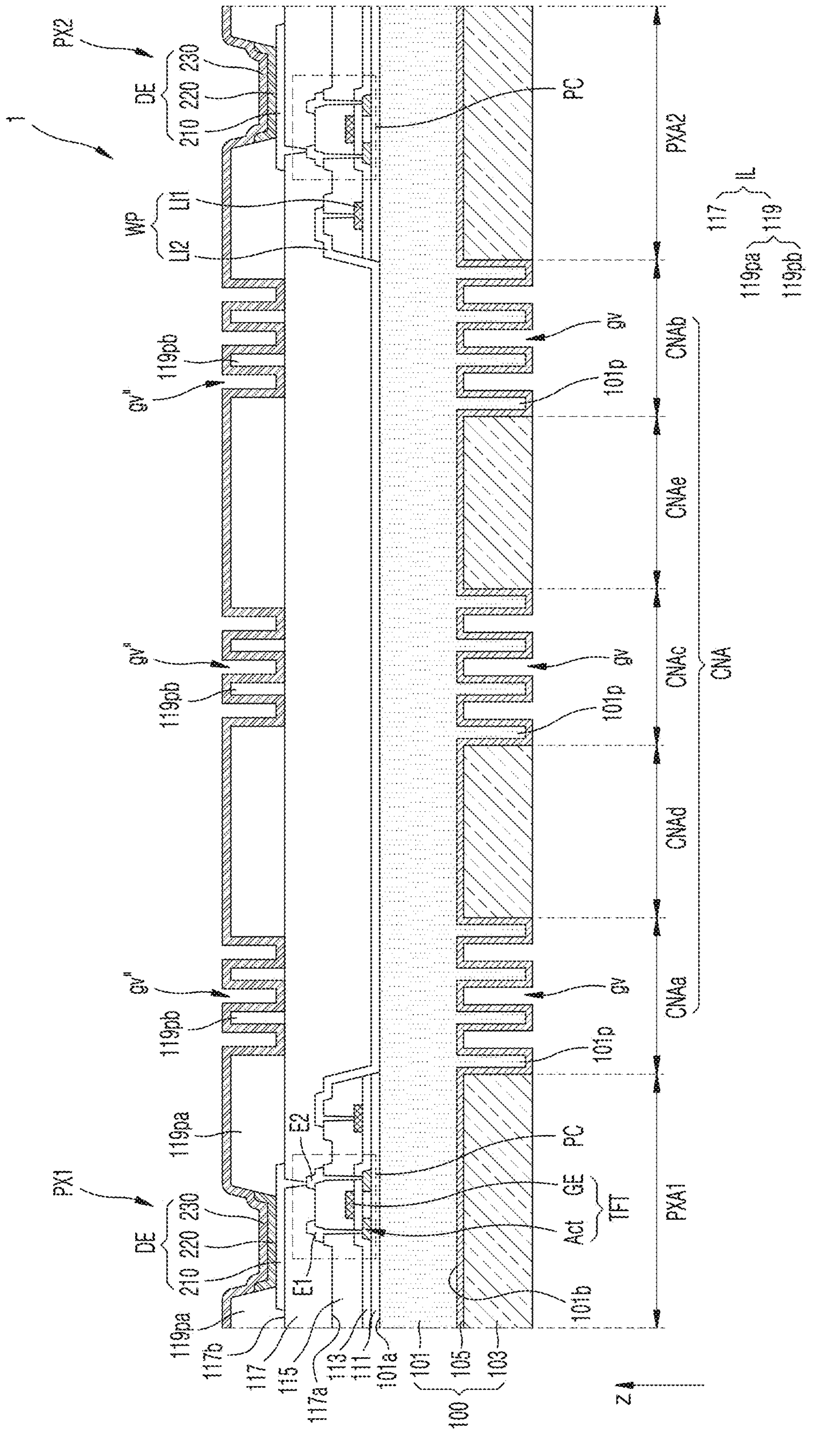
FIG. 14 is a schematic cross-sectional view of an embodiment of a display apparatus.

FIG. 14 is a schematic cross-sectional view of an embodiment of a display apparatus. FIG. 14 is a modification of FIG. 8, and is thus different therefrom in the structure of an insulating layer. Hereinafter, overlapping contents therebetween will be replaced with the description of FIG. 8, and the differences will be mainly described.

Referring to FIG. 14, in contrast with FIG. 8, a plurality of grooves gv" may be defined in an insulating layer IL including a planarization layer 117 and a pixel defining layer 119.

The planarization layer 117 may include a third surface 117*a* facing the first surface 101*a* of the first base layer 101, and a fourth surface 117*b* opposite to the third surface 117*a*. The pixel defining layer 119 may include a plurality of first insulating patterns 119*pa* exposing at least a portion of each of the pixel electrodes 210, and a plurality of second insulating patterns 119*pb* arranged in the connection area CNA. The plurality of grooves gv" may be defined by the fourth surface 117*b* of the planarization layer 117, the first insulating patterns 119*pa*, and the second insulating patterns 119*pb*.

The plurality of grooves gv" may be arranged in the connection area CNA. In an embodiment, the grooves gv" may be arranged in at least one of the first edge area CNAa, the second edge area CNAb, and the center area CNAc, for example.

Similar to the protrusions 101*p* of the first base layer 101, the plurality of grooves gv" may extend in the width direction of the connection area CNA. In an embodiment, as shown in FIG. 5, the grooves gv" defined in the connection area CNA extending in the second direction (e.g., the ±x direction) may each extend in the first direction (e.g., the ±y direction), for example. On the contrary, the grooves gv" defined in the connection area CNA extending in the first direction (e.g., the ±y direction) may each extend in the second direction (e.g., the ±x direction).

The grooves gv" may reduce the weight of the display apparatus 1 and improve the flexibility of the display apparatus 1. When an external force (such as, a bending force, a curving force, a pulling force, or a pushing force) is applied to the display apparatus 1, the shape of each of the grooves gv" may be changed, thereby easily reducing occurrence of stress during deformation of the display apparatus 1. Through the grooves gv", abnormal deformation of the display apparatus 1 may be prevented, and the durability of the display apparatus 1 may be improved.

In FIG. 14, the grooves gv" are arranged in the first edge area CNAa, the second edge area CNAb, and the center area CNAc. However, in another embodiment, the grooves gv" may be arranged only in the first edge area CNAa and the second edge area CNAb. In another embodiment, the grooves gv" may be arranged in the first area CNAd and the second area CNAe.

In FIG. 14, the first base layer 101 includes the protrusions 101*p* arranged in the first edge area CNAa, the second edge area CNAb, and the center area CNAc. However, in another embodiment, the first base layer 101 may include the protrusions of one of FIGS. 6, 9, 10, and 12.

Figure 15:
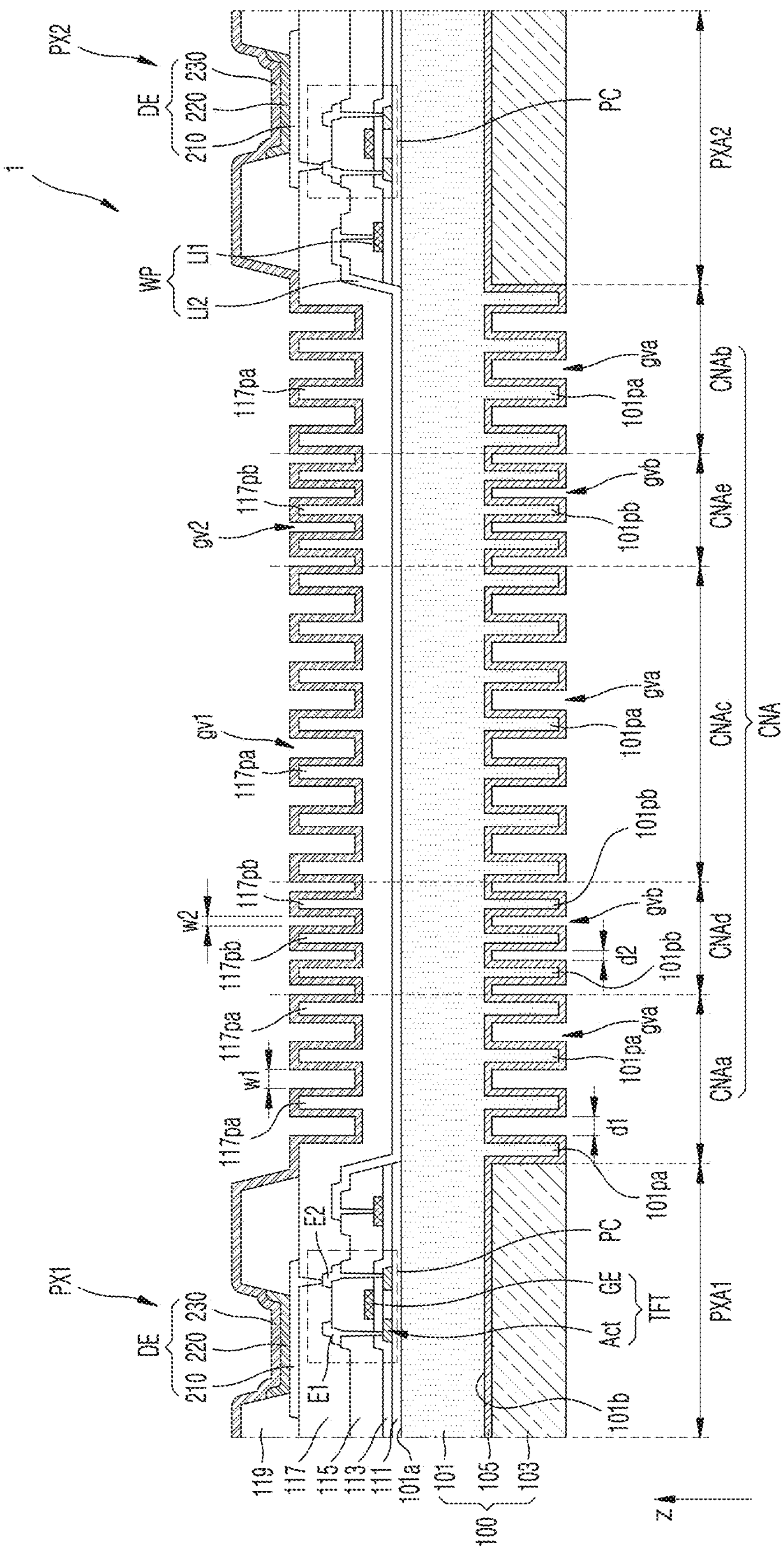
FIG. 15 is a schematic cross-sectional view of an embodiment of a display apparatus.

FIG. 15 is a schematic cross-sectional view of a display apparatus. FIG. 15 is a modification of FIG. 12, and is thus different therefrom in the structure of protrusions. Hereinafter, overlapping contents therebetween will be replaced with the description of FIG. 12, and the differences will be mainly described.

Referring to FIG. 15, in contrast with FIG. 12, a plurality of first grooves gv1 and a plurality of second grooves gv2 may be defined in the planarization layer 117 between the pixel circuit PC and the display element DE. The planarization layer 117 may include a plurality of first insulating patterns 117*pa* and a plurality of second insulating patterns 117*pb* each protruding in the +z direction, the plurality of first grooves gv1 may be defined by the plurality of first insulating patterns 117*pa*, and the plurality of second grooves gv2 may be defined by the plurality of second insulating patterns 117*pb*. The first insulating patterns 117*pa* and the second insulating patterns 117*pb* of the planarization layer 117 may be formed or provided using a halftone mask.

The plurality of first grooves gv1 and the plurality of second grooves gv2 may be arranged in the connection area CNA. In an embodiment, the plurality of first grooves gv1 may be arranged in the first edge area CNAa, the second edge area CNAb, and the center area CNAc, and the plurality of second grooves gv2 may be arranged in the first area CNAd and the second area CNAe, for example.

A first width w1 of each of the first grooves gv1 may be different from a second width w2 of each of the second grooves gv2. In an embodiment, as shown in FIG. 15, the first width w1 may be greater than the second width w2, for example.

In other words, a distance between adjacent first insulating patterns 117*pa* from among the plurality of first insulating patterns 117*pa* may be different from a distance between adjacent second insulating patterns 117*pb* from among the plurality of second insulating patterns 117*pb*. In an embodiment, the distance between the adjacent first insulating patterns 117*pa* may be greater from the distance between the adjacent second insulating patterns 117*pb*, for example.

In an embodiment, a width of each groove may be adjusted based on strain received by the connection area CNA when an external force is applied to the display apparatus 1. In other words, a distance between insulating patterns may be adjusted based on strain received by the connection area CNA when an external force is applied to the display apparatus 1.

In an embodiment, the first width w1 of each of the first grooves gv1 defined in the first edge area CNAa, the second edge area CNAb, and the center area CNAc receiving relatively great strain when an external force is applied to the connection area CNA may be greater than the second width w2 of each of the second grooves gv2 defined in the first area CNAd and the second area CNAe, for example.

In other words, a distance between the first insulating patterns 117*pa* arranged in the first edge area CNAa, the second edge area CNAb, and the center area CNAc receiving relatively great strain when an external force is applied to the connection area CNA may be greater than a distance between the second insulating patterns 117*pb* in the first area CNAd and the second area CNAe.

The plurality of first grooves gv1 and the plurality of second grooves gv2 may extend in the width direction of the connection area CNA, similar to the first protrusions 101*pa* and the second protrusions 101*pb* of the first base layer 101. In an embodiment, as shown in FIG. 11, the first grooves gv1 and the second grooves gv2 defined in the connection area CNA extending in the second direction (e.g., the ±x direction) may each extend in the first direction (e.g., the ±y direction), for example. On the contrary, the first grooves gv1 and the second grooves gv2 defined in the connection area CNA extending in the first direction (e.g., the ±y direction) may each extend in the second direction (e.g., the ±x direction).

The first groove gv1 and the second grooves gv2 may reduce the weight of the display apparatus 1 and improve the flexibility of the display apparatus 1. When an external force (such as, a bending force, a curving force, a pulling force, or a pushing force) is applied to the display apparatus 1, the shape of each of the first grooves gv1 and the second grooves gv2 may be changed, thereby easily reducing occurrence of stress during deformation of the display apparatus 1. Through the first groove gv1 and the second grooves gv2, abnormal deformation of the display apparatus 1 may be prevented, and the durability of the display apparatus 1 may be improved.

In FIG. 15, the first grooves gv1 and the second grooves gv2 are defined in the planarization layer 117. However, in another embodiment, the first grooves gv1 and the second grooves gv2 may be defined in the insulating layer IL of FIG. 14.

In FIG. 15, the first base layer 101 includes the first protrusions 101*pa* and the second protrusions 101*pb*, and the first distance d1 between the first protrusions 101*pa* and the second distance d2 between the second protrusions 101*pb* are different from each other due to strain. However, in another embodiment, the first base layer 101 may include the protrusions of one of FIGS. 6, 8, 9, and 10.

Figure 16:
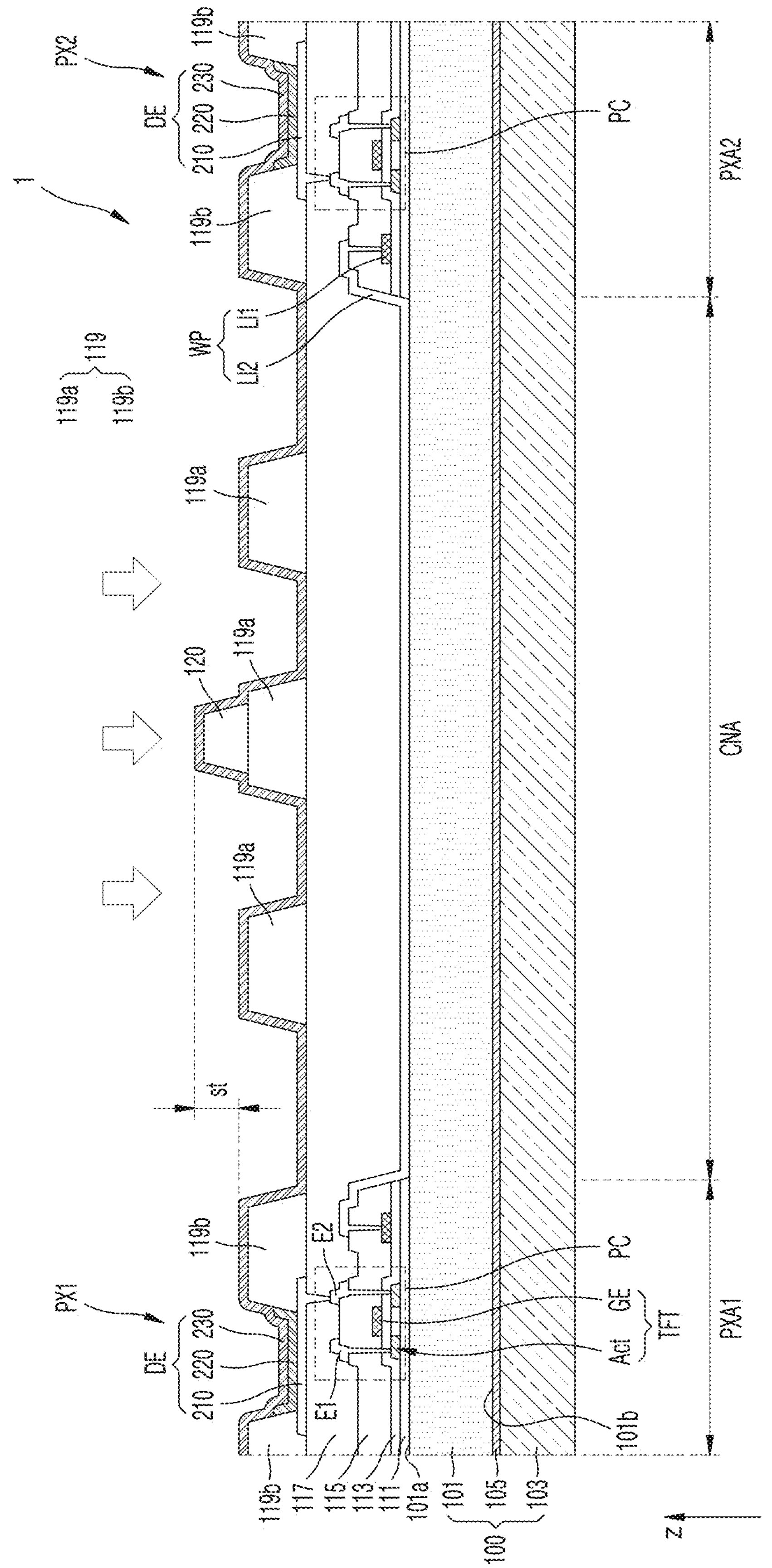
FIG. 16 is a schematic cross-sectional view of an embodiment of a display apparatus.

FIG. 16 is a schematic cross-sectional view of an embodiment of a display apparatus. The same reference numerals in FIGS. 6 and 16 denote the same elements, and thus repeated descriptions thereof are omitted.

Referring to FIG. 16, a pixel defining layer 119 may be disposed on the planarization layer 117, which is an insulating layer, between the pixel circuit PC and the display element DE. The pixel defining layer 119 may include a first insulating pattern 119*a* disposed in the connection area CNA, and a second insulating pattern 119*b* exposing at least a portion of the pixel electrode 210.

In FIG. 16, three first insulating patterns 119*a* are arranged on the planarization layer 117. However, in another embodiment, one first insulating pattern 119*a* may be disposed on the planarization layer 117. In other words, at least one first insulating pattern 119*a* may be arranged on the planarization layer 117.

A third insulating pattern 120 may be disposed on the first insulating pattern 119*a*. The third insulating pattern 120 may include an organic insulating material such as polyimide. In an alternative embodiment, the third insulating pattern 120 may include an inorganic insulating material such as a silicon nitride ($SiN_x$) or a silicon oxide ($SiO_x$), or may include an inorganic insulating material and an organic insulating material.

In an embodiment, the third insulating pattern 120 may include a different material from a material included in the first insulating pattern 119*a*. In another embodiment, the third insulating pattern 120 may include the same material as the material included in the first insulating pattern 119*a*. In this case, the first insulating pattern 119*a* and the third insulating pattern 120 may be formed or provided together in a mask process using a halftone mask or the like. The first insulating pattern 119*a* and the third insulating pattern 120 may be unitary with each other.

In FIG. 16, the third insulating pattern 120 is disposed on one first insulating pattern 119*a* from among the first insulating patterns 119*a*. However, in another embodiment, third insulating patterns 120 may be disposed on the first insulating patterns 119*a*, respectively.

The second insulating pattern 119*b* is disposed in the first pixel area PXA1 and the second pixel area PXA2, whereas the first insulating pattern 119*a* and the third insulating pattern 120 on the first insulating pattern 119*a* are arranged in the connection area CNA. Thus, a step st may be formed or provided between the first pixel area PXA1 and the second pixel area PXA2 and the connection area CNA.

When the step st is formed or provided between the first pixel area PXA1 and the second pixel area PXA2 and the connection area CNA and an upper member such as a window is attached to the upper surface of the substrate 100, some pressure may be exerted on the connection area CNA by the third insulating pattern 120. When some pressure in the −z direction is applied to the connection area CNA by the third insulating pattern 120 and the separation distance d (refer to FIG. 5) between the first pixel area PXA1 and the second pixel area PXA2 is reduced due to application of an external force to the display apparatus 1, the connection area CNA may be bent or curved in the −z direction. The first insulating pattern 119*a* and the third insulating pattern 120 arranged in the connection area CNA may induce the connection area CNA to be bent or curved in the −z direction. When the connection area CNA is inducted to be bent or curved in the −z direction by the first insulating pattern 119*a* and the third insulating pattern 120, pressure applied during attachment of an upper member is not delivered to the connection area CNA, and thus occurrence of a defect such as cutting or breaking of the connection area CNA may be reduced.

Figure 17:
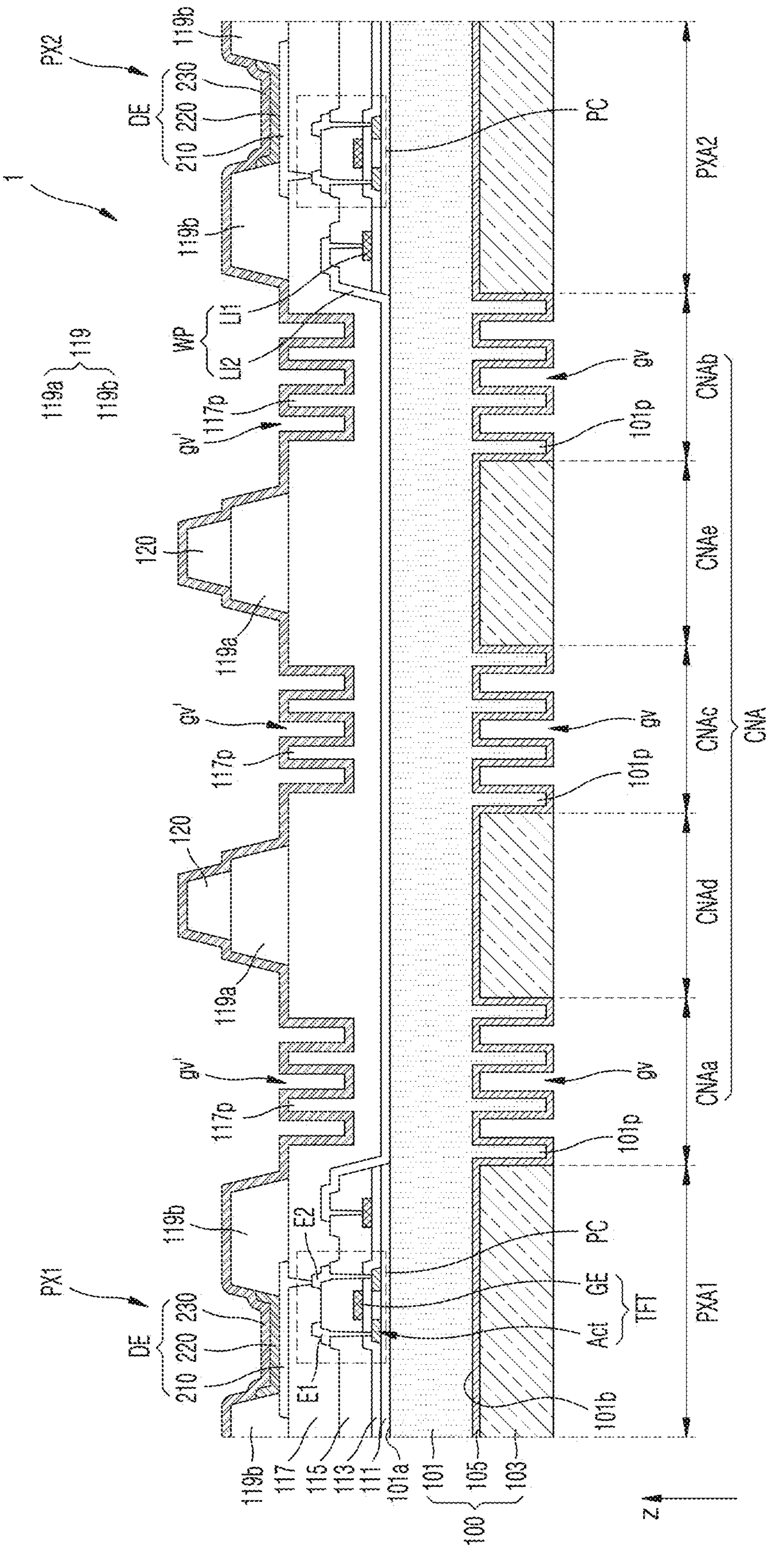
FIG. 17 is a schematic cross-sectional view of an embodiment of a display apparatus.

FIG. 17 is a schematic cross-sectional view of an embodiment of a display apparatus. FIG. 17 is a modification of FIG. 16, and is thus different therefrom in the structures of a base layer and a planarization layer. Hereinafter, overlapping contents therebetween will be replaced with the description of FIG. 16, and the differences will be mainly described.

Referring to FIG. 17, as described above with reference to FIG. 13, a plurality of grooves gv' may be defined in the planarization layer 117 between the pixel circuit PC and the display element DE. The planarization layer 117 may include a plurality of insulating patterns 117*p* each protruding in the +z direction, and the plurality of grooves gv' may be defined by the plurality of insulating patterns 117*p*. The insulating patterns 117*p* of the planarization layer 117 may be formed or provided using a halftone mask.

The pixel defining layer 119 including the first insulating pattern 119*a* and the second insulating pattern 119*b* may be disposed on the planarization layer 117 in which the grooves gv' are defined, and the third insulating pattern 120 may be disposed on the first insulating pattern 119*a*.

In FIG. 17, two first insulating patterns 119*a* and two third insulating patterns 120 are arranged on the planarization layer 117. However, in another embodiment, one first insulating pattern 119*a* and one third insulating pattern 120 may be arranged on the planarization layer 117. In other words, at least one first insulating pattern 119*a* and at least one third insulating pattern 120 may be arranged on the planarization layer 117.

In an embodiment, the grooves gv' may not overlap the first insulating pattern 119*a* and the third insulating pattern 120. In an embodiment, as shown in FIG. 17, the grooves gv' may be arranged in at least one of the first edge area CNAa, the second edge area CNAb, and the center area CNAc, and the first insulating pattern 119*a* and the third insulating pattern 120 may be arranged in at least one of the first area CNAd and the second area CNAe, for example.

In FIG. 17, the grooves gv' are defined in the planarization layer 117. However, in another embodiment, the grooves gv" may be defined in the insulating layer IL as shown in FIG. 14. In this case, the third insulating pattern 120 may be disposed on the insulating layer IL not to overlap the grooves gv".

In FIG. 17, the grooves gv' are arranged in the first edge area CNAa, the second edge area CNAb, and the center area CNAc. However, in another embodiment, the grooves gv' may be arranged only in the first edge area CNAa and the second edge area CNAb. In an alternative embodiment, the grooves gv' may be arranged only in the center area CNAc.

In FIG. 17, the first base layer 101 includes the protrusions 101*p* arranged in the first edge area CNAa, the second edge area CNAb, and the center area CNAc. However, in another embodiment, the first base layer 101 may include the protrusions of one of FIGS. 6, 9, 10, and 12.

Figure 18:
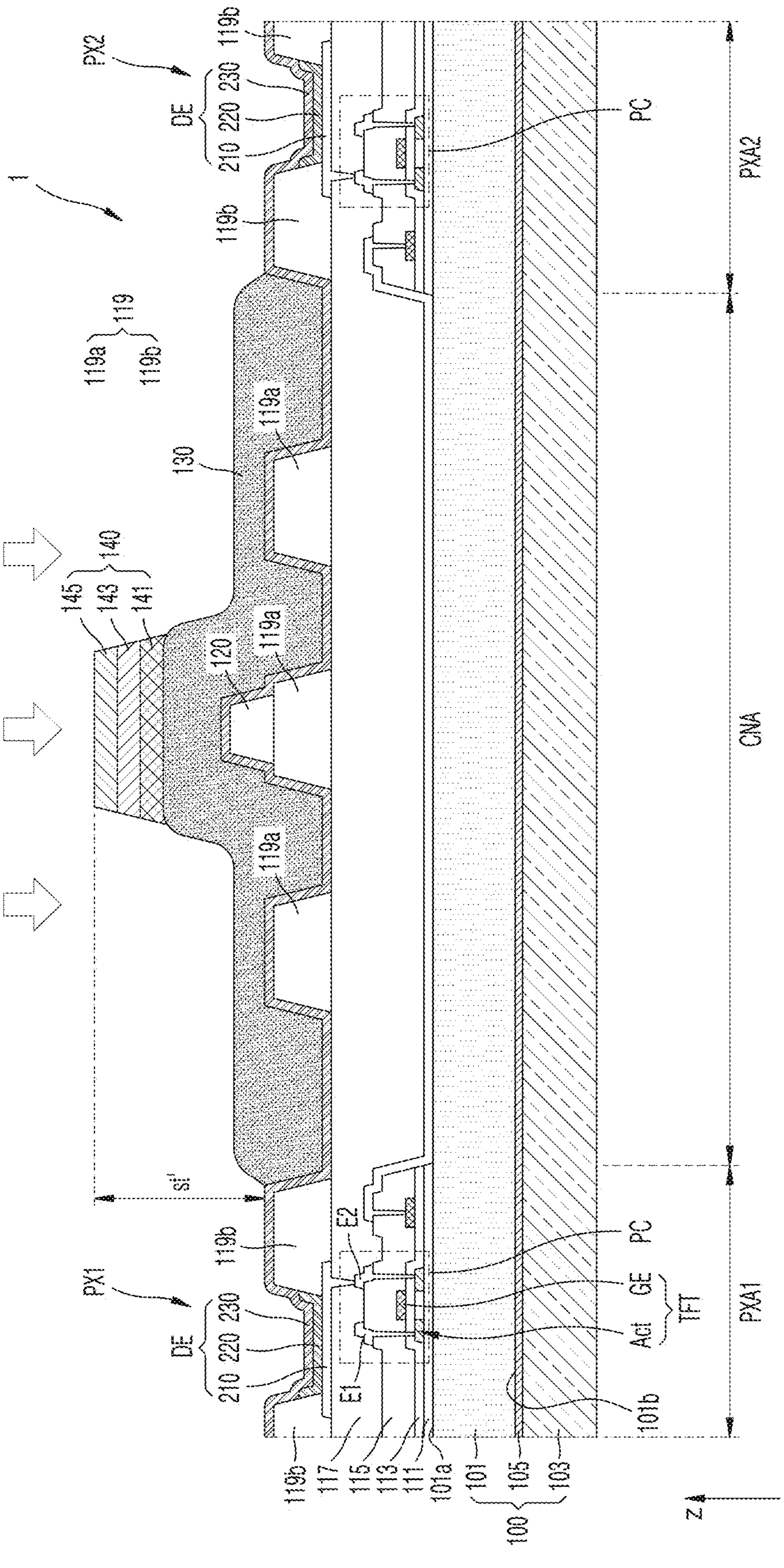
FIG. 18 is a schematic cross-sectional view of an embodiment of a display apparatus.

FIG. 18 is a schematic cross-sectional view of a display apparatus. FIG. 18 is a modification of FIG. 16, and is thus different therefrom in the structures of a light-shielding layer and a color filter layer. Hereinafter, overlapping contents therebetween will be replaced with the description of FIG. 16, and the differences will be mainly described.

Referring to FIG. 18, a light-shielding layer 130 may be disposed on the third insulating pattern 120. The light-shielding layer 130, which is a black matrix, may be a layer for improving color sharpness and contrast. The light-shielding layer 130 may include at least one of a black pigment, a black dye, and black particles. In some embodiments, the light-shielding layer 130 may include a material such as Cr or $CrO_x$, $Cr/CrO_x$, $Cr/CrO_x/CrN_y$, resin (e.g., a carbon pigment or an RGB mixed pigment), graphite, a non-Cr-based material, etc.

A color filter layer 140 may be disposed on the light-shielding layer 130. The color filter layer 140 may include a first color filter layer 141, a second color filter layer 143, and a third color filter layer 145 sequentially stacked on one another. The first color filter layer 141 may transmit only light having a wavelength ranging from about 630 nanometers (nm) to about 780 nm, the second color filter layer 143 may transmit only light having a wavelength ranging from about 495 nm to about 570 nm, and the third color filter layer 145 may transmit only light having a wavelength ranging from about 450 nm to about 495 nm.

Because the light shielding layer 130 and the color filter layer 140 are arranged in the connection area CNA, a step st' may be formed or provided between the first pixel area PXA1 and the second pixel area PXA2 and the connection area CNA.

When the step st' is formed or provided between the first pixel area PXA1 and the second pixel area PXA2 and the connection area CNA and an upper member such as a window is attached to the upper surface of the substrate 100, some pressure may be exerted on the connection area CNA by the light-shielding layer 130 and the color filter layer 140. When some pressure in the −z direction is applied to the connection area CNA by the light-shielding layer 130 and the color filter layer 140 and the separation distance d (refer to FIG. 5) between the first pixel area PXA1 and the second pixel area PXA2 is reduced due to application of an external force to the display apparatus 1, the connection area CNA may be bent or curved in the −z direction. The light-shielding layer 130 and the color filter layer 140 arranged in the connection area CNA may induce the connection area CNA to be bent or curved in the −z direction. When the connection area CNA is inducted to be bent or curved in the −z direction by the light-shielding layer 130 and the color filter layer 140, pressure applied during attachment of an upper member is not delivered to the connection area CNA, and thus occurrence of a defect such as cutting or breaking of the connection area CNA may be reduced.

In FIG. 18, the light shielding layer 130 covers the connection area CNA. However, in another embodiment, the light shielding layer 130 may be disposed in a portion of the connection area CNA. In an embodiment, the light shielding layer 130 may include light-shielding patterns that cover the first insulating patterns 119*a*, respectively, for example.

Although a display apparatus has been described above, the invention is not limited thereto. A method of manufacturing such a display apparatus also belongs to the scope of the invention, for example.

In an embodiment as described above, a display apparatus having increased flexibility may be realized. Of course, the scope of the invention is not limited thereto.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the attached claims.

What is claimed is:

1. A display apparatus comprising:

a first base layer including a first pixel area and a second pixel area spaced apart from each other, and a connection area connecting the first pixel area to the second pixel area, the first base layer including a first surface and a second surface opposite to each other;

a first pixel disposed in the first pixel area; and a second pixel disposed in the second pixel area, wherein the first pixel and the second pixel are arranged on the first surface of the first base layer, the first base layer includes a plurality of first protrusions arranged on the second surface of the connection area only without being disposed on the first surface, and the plurality of first protrusions is arranged on opposite ends of the connection area in a non-contracted state.

2. The display apparatus of claim 1, wherein the plurality of first protrusions extends in a width direction of the connection area.

3. The display apparatus of claim 1, further comprising:

a second base layer disposed on the second surface of the first base layer; and a barrier layer between the first base layer and the second base layer, wherein the second base layer does not overlap the plurality of first protrusions in a thickness direction of the second base layer, and the barrier layer covers the plurality of first protrusions.

4. The display apparatus of claim 3, wherein a thickness of the second base layer is substantially equal to a length of each of the plurality of first protrusions in a thickness direction of the second base layer.

5. The display apparatus of claim 1, wherein the first base layer further includes a plurality of second protrusions arranged on the second surface of each of the first pixel area and the second pixel area.

6. The display apparatus of claim 1, wherein the connection area includes a center area, a first edge area between the center area and the first pixel area, and a second edge area between the center area and the second pixel area, and the plurality of first protrusions is arranged in the center area, the first edge area, and the second edge area.

7. The display apparatus of claim 6, wherein the first base layer further includes a plurality of second protrusions arranged on the second surface of the connection area, the connection area further includes a first area between the center area and the first edge area, and a second area between the center area and the second edge area, the plurality of second protrusions is arranged in the first area and the second area, and a first distance between adjacent first protrusions from among the plurality of first protrusions is different from a second distance between adjacent second protrusions among the plurality of second protrusions.

8. The display apparatus of claim 7, wherein the first distance is greater than the second distance.

9. The display apparatus of claim 1, further comprising an insulating layer disposed on the first surface of the first base layer and in which a plurality of first grooves is defined in the connection area.

10. The display apparatus of claim 9, wherein the connection area includes a center area, a first edge area between the center area and the first pixel area, and a second edge area between the center area and the second pixel area, and the plurality of first grooves is arranged in at least one of the center area, the first edge area, and the second edge area.

11. The display apparatus of claim 10, wherein a plurality of second grooves is defined in the insulating layer in the connection area, the connection area further includes a first area between the center area and the first edge area, and a second area between the center area and the second edge area, the plurality of first grooves is arranged in the center area, the first edge area, and the second edge area, the plurality of second grooves is arranged in the first area and the second area, and a first width of each of the plurality of first grooves is different from a second width of each of the plurality of second grooves.

12. The display apparatus of claim 11, wherein the first width is greater than the second width.

13. The display apparatus of claim 9, wherein each of the first pixel and the second pixel includes a pixel circuit, and a display element disposed on the pixel circuit and connected to the pixel circuit, and the insulating layer is between the plurality of pixel circuits and the plurality of display elements.

14. The display apparatus of claim 9, wherein each of the first pixel and the second pixel includes a pixel circuit, and a display element including a pixel electrode disposed on the pixel circuit and connected to the pixel circuit, and the insulating layer includes a planarization layer between the pixel circuits of the first and second pixels and the display elements of the first and second pixels, and a pixel defining layer disposed on the planarization layer and exposing at least a portion of each of the pixel electrodes of the first pixel and the second pixel.

15. The display apparatus of claim 14, wherein the planarization layer includes a third surface facing the first surface of the first base layer, and a fourth surface opposite to the third surface, the pixel defining layer includes a plurality of first insulating patterns exposing at least a portion of each of the plurality of pixel electrodes, and a plurality of second insulating patterns arranged in the connection area, and the plurality of first grooves is defined by a portion of the fourth surface of the planarization layer, the plurality of first insulating patterns, and the plurality of second insulating patterns.

* * * * *